(12) United States Patent
Asaoka et al.

(10) Patent No.: US 11,329,105 B2
(45) Date of Patent: May 10, 2022

(54) DISPLAY DEVICE

(71) Applicant: Sharp Kabushiki Kaisha, Sakai (JP)

(72) Inventors: Yasushi Asaoka, Sakai (JP); Tsuyoshi Kamada, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 62 days.

(21) Appl. No.: 16/724,547

(22) Filed: Dec. 23, 2019

(65) Prior Publication Data

US 2020/0212122 A1 Jul. 2, 2020

(30) Foreign Application Priority Data

Dec. 27, 2018 (WO) .................. PCT/JP2018/048352

(51) Int. Cl.
*H01L 27/32* (2006.01)
*H01L 51/52* (2006.01)
(Continued)

(52) U.S. Cl.
CPC ...... *H01L 27/3225* (2013.01); *H01L 27/3211* (2013.01); *H01L 27/3232* (2013.01);
(Continued)

(58) Field of Classification Search
CPC ........ G02B 6/29361; G02B 2027/0114; G02B 27/141; G02B 27/149; H04N 1/488; F21V 9/04; F21V 9/20; F21V 7/22; F21V 7/30; G03B 33/12; H01Q 15/0013; G01J 2003/1213; H01L 27/3211; H01L 51/502; H01L 51/5253; H01L 51/5271; H01L 51/5284; H01L 31/0549; H01L 27/14625; H01L 27/14629; H01L 33/10; H01L 33/405; H01L 33/42; H01L 33/46; H01L 33/58; H01L 33/60; H01L 51/5218;
(Continued)

(56) References Cited

U.S. PATENT DOCUMENTS 4,125,405 A * 11/1978 Araujo ...................... C03C 4/04
430/616
6,700,692 B2 * 3/2004 Tonar ....................... C09K 9/02
359/265
(Continued)

FOREIGN PATENT DOCUMENTS

| JP | 2016-085305 A | 5/2016 |
|---|---|---|
| JP | 2017-129849 A | 7/2017 |
| WO | 2014/196414 A2 | 12/2014 |

*Primary Examiner* — Eduardo A Rodela
(74) *Attorney, Agent, or Firm* — Keating & Bennett, LLP

(57) ABSTRACT

A light absorbing member includes a first dichroic dye and a second dichroic dye. The first dichroic dye has an absorption peak wavelength between a first emission peak wavelength of the first light-emitting layer and a second emission peak wavelength of a second light-emitting layer. The second dichroic dye has an absorption peak wavelength between the second emission peak wavelength of the second light-emitting layer and a third emission peak wavelength of the third light-emitting layer. An angle of a molecule of the first dichroic dye in an absorption axis and an angle of a molecule of the second dichroic dye in an absorption axis with respect to a normal direction of the reflective layer are from 70 degrees to 90 degrees.

19 Claims, 12 Drawing Sheets

(51) Int. Cl.
  *H01L 51/50* (2006.01)
  *H01L 33/10* (2010.01)
  *H01L 33/60* (2010.01)
  *G02B 5/30* (2006.01)
(52) U.S. Cl.
  CPC .............. *H01L 33/10* (2013.01); *H01L 33/60* (2013.01); *H01L 51/502* (2013.01); *H01L 51/5253* (2013.01); *H01L 51/5271* (2013.01); *H01L 51/5284* (2013.01); *G02B 5/3083* (2013.01)
(58) Field of Classification Search
  CPC ............. H01L 51/5262; H01L 51/5265; H01L 51/5293; H01L 27/3225; H01L 27/3232; H01L 27/3246
  See application file for complete search history.

(56) References Cited

U.S. PATENT DOCUMENTS

| | | | | |
|---|---|---|---|---|
| 2004/0201793 A1* | 10/2004 | Anandan | ............. | G02F 1/13475 349/61 |
| 2006/0285217 A1* | 12/2006 | Roth | ................... | G02B 27/145 359/634 |
| 2007/0279560 A1* | 12/2007 | Ishitani | ............. | G02F 1/133502 349/116 |
| 2012/0320298 A1* | 12/2012 | Suzuki | ............... | G02F 1/133553 349/43 |
| 2013/0027656 A1* | 1/2013 | Escuti | ................. | G02B 5/3083 349/193 |
| 2013/0307759 A1* | 11/2013 | Jang | ...................... | H01L 27/322 345/76 |
| 2014/0226096 A1* | 8/2014 | Taheri | ................. | G02F 1/13306 349/33 |
| 2016/0092005 A1* | 3/2016 | Toyoshima | ......... | G02F 1/13363 345/174 |
| 2017/0141345 A1* | 5/2017 | Park | .................... | H01L 51/5265 |
| 2017/0205664 A1 | 7/2017 | Cho et al. | | |
| 2017/0235191 A1* | 8/2017 | Jang | ................. | G02F 1/133504 349/64 |
| 2018/0069190 A1* | 3/2018 | Kim | .................... | H01L 27/1108 |
| 2018/0210253 A1* | 7/2018 | Kashima | ............... | G02F 1/1334 |
| 2019/0074470 A1* | 3/2019 | Takagi | ................ | H01L 51/0097 |
| 2020/0018879 A1* | 1/2020 | Katou | .................... | C09B 31/043 |
| 2020/0201123 A1* | 6/2020 | Wang | ..................... | G02B 30/25 |
| 2020/0264361 A1* | 8/2020 | Yuan | .................... | C09K 11/7731 |
| 2020/0379277 A1* | 12/2020 | Lu | .......................... | G02F 1/0147 |
| 2021/0238481 A1* | 8/2021 | Kirsch | .................. | C09K 19/601 |
| 2021/0299879 A1* | 9/2021 | Pinter | ................... | G06T 7/0004 |
| 2021/0311342 A1* | 10/2021 | Lim | ................... | G02B 27/0018 |

* cited by examiner

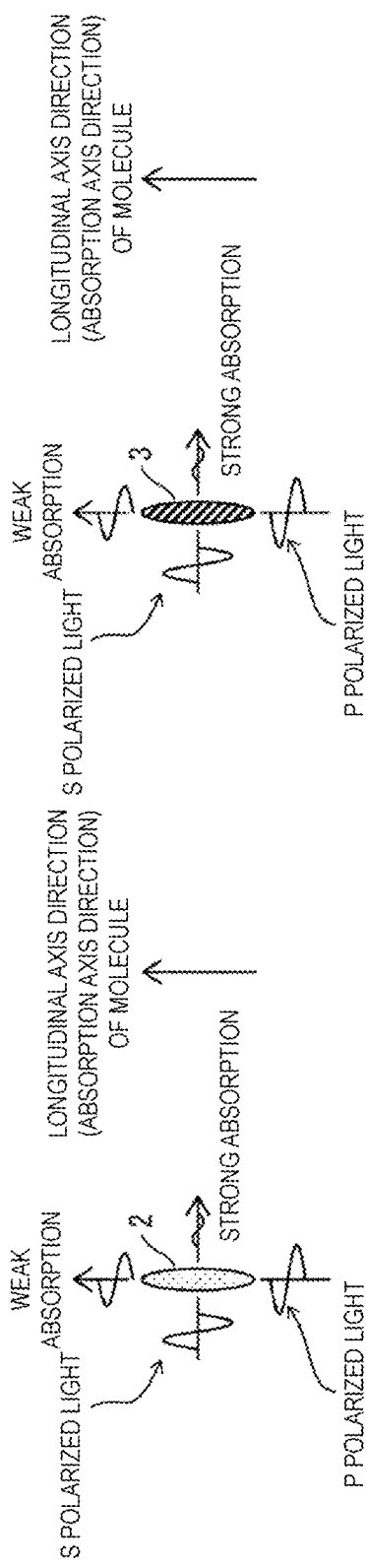
FIG. 6A
FIG. 6B
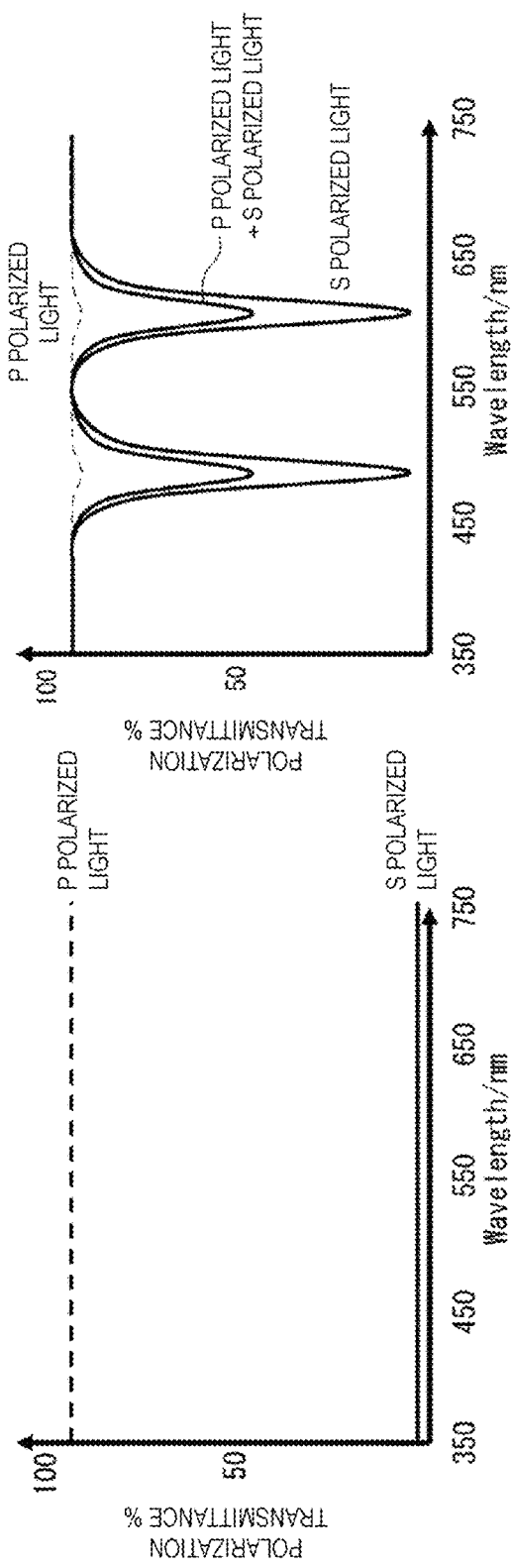
FIG. 6C
FIG. 6D

DISPLAY DEVICE

CROSS-REFERENCE TO RELATED APPLICATIONS

This application claims the benefit of priority to International Patent Application Number PCT/JP2018/048352 filed on Dec. 27, 2018. The entire contents of the above-identified application are hereby incorporated by reference.

BACKGROUND

Technical Field

The present disclosure relates to a display device.

In recent years, various display devices have been developed. Particularly, a display device including an Organic Light Emitting Diode (OLED) and a display device including an inorganic light emitting diode or a Quantum dot Light Emitting Diode (QLED) have drawn a great deal of attention because the devices are capable of achieving lower power consumption, smaller thickness, higher picture quality, and the like.

Such a display device includes a reflective electrode formed of a material having a relatively high reflectivity in order to efficiently emit light from a light-emitting layer to a user side. However, under intense external light such as intense solar light outdoors and intense illumination light indoors, for example, a contrast ratio of the display device is lowered due to the reflective electrode that reflects the external light, which causes a problem of display quality degradation.

In order to suppress such external light reflection, there is proposed a configuration of providing a circular polarizer on a surface of a display device. However, in a case of such configuration, the circular polarizer disadvantageously absorbs about a half of light emitted to a user side, which causes a problem of reduction in luminance of the display device.

WO 2014/196414 (publicized on Dec. 11, 2014) describes that a display device can improve a contrast ratio and color purity by using a polarizer formed of a base material that contains azo compounds and has a polarization function.

SUMMARY

However, in a case of the display device including the polarizer formed of the base material that contains azo compounds and has a polarization function described in WO 2014/196414 (publicized on Dec. 11, 2014), an emission peak wavelength from a light-emitting layer overlaps with an absorption wavelength range of the polarizer. Therefore, with such configuration, a display device having high light usage efficiency cannot be achieved. A problem of reduction in luminance of the display device is caused.

An aspect of the present disclosure has been made in view of the above-mentioned problems, and has an object to provide a display device, which has a high bright place contrast ratio, high color purity, and high light usage efficiency and suppresses reduction in luminance, and a method for manufacturing the display device.

In order to solve the above-mentioned problem, a display device according to one aspect of the present disclosure includes:

a first light-emitting layer having a first emission peak wavelength;

a second light-emitting layer having a second emission peak wavelength longer than the first emission peak wavelength;

a third light-emitting layer having a third emission peak wavelength longer than the second emission peak wavelength;

a reflective layer configured to reflect light, the reflective layer being provided as a lower layer to the first light-emitting layer, the second light-emitting layer, and the third light-emitting layer; and a light absorbing member including at least one kind selected from a first dichroic dye and a second dichroic dye, the light absorbing member being provided as an upper layer to the first light-emitting layer, the second light-emitting layer, and the third light-emitting layer, wherein the first dichroic dye has an absorption peak wavelength between the first emission peak wavelength and the second emission peak wavelength, the second dichroic dye has an absorption peak wavelength between the second emission peak wavelength and the third emission peak wavelength, and an angle of a molecule of the first dichroic dye in an absorption axis direction and an angle of a molecule of the second dichroic dye in an absorption axis direction with respect to a normal direction of the reflective layer are from 70 degrees to 90 degrees.

In order to solve the above-mentioned problem, a method of manufacturing a display device according to an aspect of the present disclosure is a method of manufacturing a display device, the display device configured to emit light having a first emission peak wavelength, a second emission peak wavelength longer than the first emission peak wavelength, and a third emission peak wavelength longer than the second emission peak wavelength, the method including:

forming a light-emitting layer forming:

a first light-emitting layer configured to emit light having the first emission peak wavelength;

a second light-emitting layer configured to emit light having the second emission peak wavelength; and a third light-emitting layer configured to emit light having the third emission peak wavelength; and forming a light absorbing member including:

a first dichroic dye having an absorption peak wavelength between the first emission peak wavelength and the second emission peak wavelength;

a second dichroic dye having an absorption peak wavelength between the second emission peak wavelength and the third emission peak wavelength; and a resin.

In order to solve the above-mentioned problem, a method of manufacturing a display device according to an aspect of the present disclosure is a method of manufacturing a display device, the display device configured to emit light having a first emission peak wavelength, a second emission peak wavelength longer than the first emission peak wavelength, and a third emission peak wavelength longer than the second emission peak wavelength, the method including:

forming a light-emitting layer forming:

a first light-emitting layer configured to emit light having the first emission peak wavelength;

a second light-emitting layer configured to emit light having the second emission peak wavelength; and a third light-emitting layer configured to emit light having the third emission peak wavelength;

forming a first light absorbing member including:
   a first dichroic dye having an absorption peak wavelength between the first emission peak wavelength and the second emission peak wavelength; and
   a first resin; and
forming a second light absorbing member including:
   a second dichroic dye having an absorption peak wavelength between the second emission peak wavelength and the third emission peak wavelength; and
   a second resin.

According to the aspect of the present disclosure, the display device, which has a high bright place contrast ratio, high color purity, and high light usage efficiency and suppresses reduction in luminance, and the method for manufacturing the display device can be provided.

BRIEF DESCRIPTION OF DRAWINGS

The disclosure will be described with reference to the accompanying drawings, wherein like numbers reference like elements.

FIG. 6A is a diagram for illustrating an absorption axis direction and a light absorption characteristic of a molecule of a first dichroic dye.

FIG. 6B is a diagram for illustrating an absorption axis direction and a light absorption characteristic of a molecule of a second dichroic dye.

FIG. 6C is a diagram illustrating a general polarization transmittance of a polarizing plate in a related art.

FIG. 6D is a diagram illustrating a polarization transmittance of the light absorbing member included in the display device according to the first embodiment.

DESCRIPTION OF EMBODIMENTS

Figure 1A:
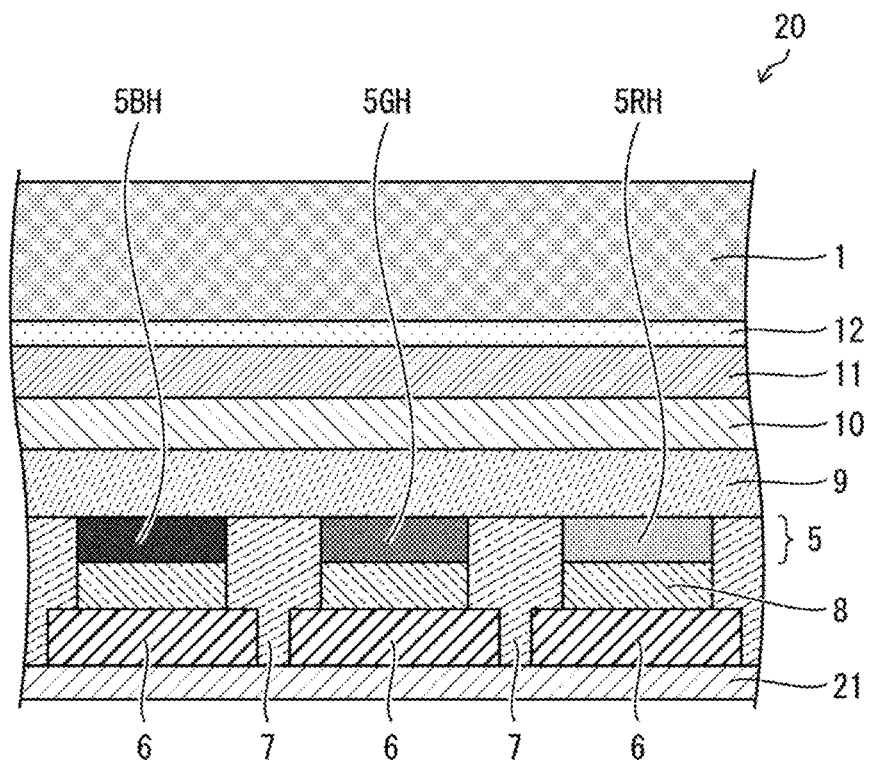
FIG. 1A is a diagram illustrating a schematic configuration of a display device according to a first embodiment.

A description follows regarding embodiments of the present disclosure, with reference to FIG. 1 to FIG. 13. Hereinafter, for convenience of description, components having the same functions as those described in a specific embodiment are denoted by the same reference numerals, and descriptions thereof may be omitted.

First Embodiment

Figure 1B:
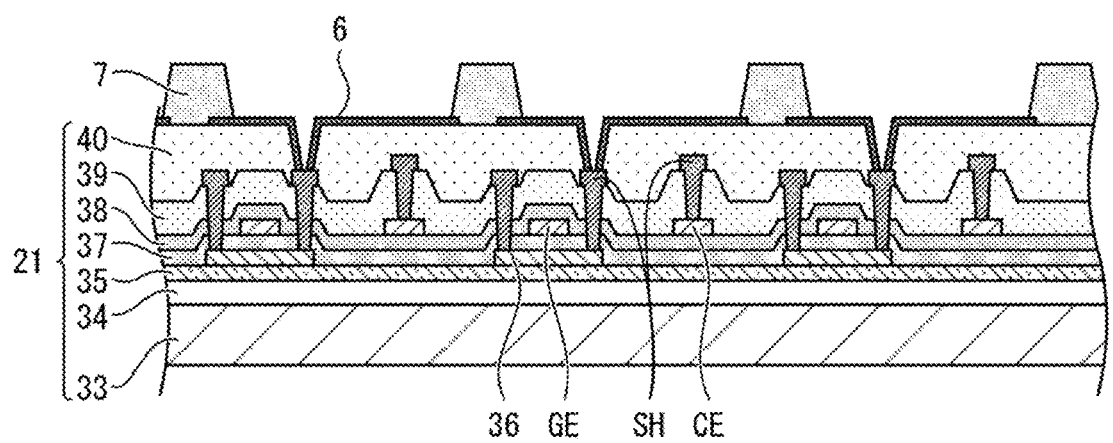
FIG. 1B is a diagram illustrating first electrodes, banks, and an active matrix substrate that are included in the display device according to the first embodiment.

FIG. 1A is a diagram illustrating a schematic configuration of a display device 20 according to a first embodiment. FIG. 1B is a diagram illustrating first electrodes (reflective layers) 6, banks 7, and an active matrix substrate 21 that are included in the display device 20 according to the first embodiment.

As illustrated in FIG. 1A, the first electrodes 6 are formed on the active matrix substrate 21, each of which is a pixel electrode provided to a pixel and capable of applying a voltage individually to the pixel. The banks 7 are formed so as to cover ends of the plurality of first electrodes 6 and regions between the adjacent first electrodes 6. Further, in parts surrounded by the banks 7 on the first electrodes 6, in other words, in opening parts of the banks 7, hole transport layers 8 and light-emitting layers 5 are formed. Moreover, an electron transport layer 9 is formed to cover the banks 7 and the light-emitting layers 5, and a second electrode 10 being a common electrode is formed so as to cover the electron transport layer 9.

In the present embodiment, a case where the hole transport layers 8 are formed in island shapes only in the opening parts of the banks 7 is given as an example, but the present embodiment is not limited thereto. The hole transport layer 8 may be formed as one common layer over the opening parts of the banks 7 and the banks 7.

A part formed by overlapping the first electrode 6, the hole transport layer 8, a blue-light-emitting layer 5BH, the electron transport layer 9, and the second electrode 10 with one another is a first light-emitting element being a blue-light-emitting element. A part formed by overlapping the first electrode 6, the hole transport layer 8, a green-light-emitting layer 5GH, the electron transport layer 9, and the second electrode 10 with one another is a second light-emitting element being a green-light-emitting element. A part formed by overlapping the first electrode 6, the hole transport layer 8, a red-light-emitting layer 5RH, the electron transport layer 9, and the second electrode 10 with one another is a third light-emitting element being a red-light-emitting element.

A sealing layer 11 is formed on the second electrode 10, and a light absorbing member 1 is formed on the sealing layer 11 through intermediation with an adhesive material layer 12.

Note that, the display device 20 according to the first embodiment may include a color filter layer as an upper layer to the second electrode 10 as needed. Note that, the upper layer in this specification indicates a layer present at a position closer to a viewer present on a light emitting side of the display device, and indicates, in FIG. 1, a layer present on an upper side of FIG. 1.

The first electrode 6 is formed of a conductive material, and may have a function as a hole injection layer (HIL) for injecting a positive hole in the hole transport layer 8. Meanwhile, the second electrode 10 is formed of a conductive material, and may have a function as an electron injection layer (EIL) for injecting an electron in the electron transport layer 9. The hole transport layer 8 may have a function as a hole injection layer (HIL), and the electron transport layer 9 may have a function as an electron injection layer (EIL).

In the present embodiment, a case where the first electrode 6 is an anode electrode and the second electrode 10 is a cathode electrode is given as an example, but the present embodiment is not limited thereto. The first electrode 6 may be a cathode electrode, and the second electrode 10 may be an anode electrode. In this case, the hole transport layer (HTL) 8 is formed on the anode electrode side, and the electron transport layer (ETL) 9 is formed on the cathode electrode side.

Note that, in the present embodiment, a case where the display device 20 is a top-emitting type is given as an example, but the present embodiment is not limited thereto. The display device may be a bottom-emitting type. In the case of the bottom-emitting type, an arrangement position of the light absorbing member 1 provided to the light emitting side described later is on a side opposite to the display device 20.

The display device 20 is a top-emitting type. Thus, the second electrode 10 being an upper layer is formed of a light-transmissive material, and the first electrode 6 being a lower layer is formed of a light-reflective material.

For the first electrode 6, a metal material having high reflectivity of visible light, such as Al, Cu, Au, and Ag, may be used. For the first electrode 6, an alloy containing, for example, Indium Tin Oxide (ITO) and Ag, which has high reflectivity of visible light, may be used for lamination. Alternatively, metal having high reflectivity such as Al and Ag and a conductive material having high transmittance such as ITO may be laminated.

For the second electrode 10, a light-transmissive material having high transmittance of visible light, such as Indium Tin Oxide (ITO), Indium Zinc Oxide (IZO), ZnO, aluminum-doped zinc oxide (AZO), and boron-doped zinc oxide (BZO), may be used. Alternatively, silver nanowire, graphene, an alloy containing magnesium and silver, and the like may be used.

Note that, in the present embodiment, a case where the hole transport layers 8, the light-emitting layers 5, and the electron transport layer 9 are formed between the first electrodes 6 and the second electrode 10 is given as an example, but the present embodiment is not limited thereto. For example, a hole injection layer (HIL) may be provided between the first electrodes 6 and the hole transport layers 8, and an electron injection layer (EIL) may be provided between the electron transport layer 9 and the second electrode 10. Further, an electron blocking layer may be provided between the light-emitting layers 5 and the hole transport layers 8, and a hole blocking layer may be provided between the light-emitting layers 5 and the electron transport layer 9. The hole injection layer, the hole transport layers 8, the electron transport layer 9, the electron injection layer, the electron blocking layer, and the hole blocking layer, which are other than the light-emitting layers 5, may be omitted as appropriate. The hole injection layer, the hole transport layers 8, the electron transport layer 9, the electron injection layer, the electron blocking layer, and the hole blocking layer, which are other than the light-emitting layers 5, may be formed in island shapes similarly to the light-emitting layers 5, or may be formed on the entire surface of the display region as one common layer similarly to the second electrode 10.

The banks 7 may be formed of a coatable photosensitive organic material, such as a polyimide resin and an acrylic resin.

The sealing layer 11 is transparent, and may be formed of a transparent inorganic film, a transparent organic film, or a layered film formed of a transparent inorganic film and a transparent organic film. In the present embodiment, a layered film, which is formed of a first transparent inorganic film covering the second electrode 10, a transparent organic film formed on an upper side of the first transparent inorganic film, and a second transparent inorganic film covering the transparent organic film, is used as the sealing layer. With this, foreign matters such as moisture and oxygen are prevented from penetrating the first light-emitting element including the blue-light-emitting layer 5BH, the second light-emitting element including the green-light-emitting layer 5GH, and the third light-emitting element including the red-light-emitting layer 5RH.

Note that, each of the first transparent inorganic film and the second transparent inorganic film may be formed, for example, by the CVD, of a silicon oxide film, a silicon nitride film, or a silicon oxynitride film, or by a layered film of these. The transparent organic film may be formed of a coatable photosensitive organic material, such as a polyimide resin and an acrylic resin, which is thicker than the first transparent inorganic film and the second transparent inorganic film.

The light absorbing member 1 described later is attached on the sealing layer 11 through intermediation with the adhesive material layer 12 formed of an Optical Clear Adhesive (OCA) or an Optical Clear Resin (OCR).

The display device 20 according to the first embodiment illustrated in FIG. 1A includes the active matrix substrate 21 illustrated in FIG. 1B.

The active matrix substrate 21 includes a substrate 33, a resin layer 34, a barrier layer 35, a semiconductor layer 36, an inorganic insulating film 37 (gate insulating film), an inorganic insulating film 38, an inorganic insulating film 39, and a flattening film 40.

As illustrated in FIG. 1B, the active matrix substrate 21 includes the semiconductor layer 36, the inorganic insulating film 37 (gate insulating film) being an upper layer to the semiconductor layer 36, a gate electrode layer GE being an upper layer to the inorganic insulating film 37, the inorganic insulating film 38 being an upper layer to the gate electrode layer GE, a capacitance electrode layer CE being an upper layer to the inorganic insulating film 38, the inorganic insulating film 39 being an upper layer to the capacitance electrode layer CE, a source drain electrode layer SH including source drain electrodes, which is an upper layer to the inorganic insulating film 39, and the flattening film 40 being an upper layer to the source drain electrode layer SH.

Thin film transistor elements (TFT elements) being active elements include the semiconductor layer 36, the inorganic insulating film 37 (gate insulating film), the gate electrode layer GE, the inorganic insulating film 38, the inorganic insulating film 39, and the source drain electrode layer SH. The semiconductor layer 36, the inorganic insulating film 37 (gate insulating film), the gate electrode layer GE, the inorganic insulating film 38, the inorganic insulating film 39, and the source drain electrode layer SH are also referred to as active element layers.

As illustrated in FIGS. 1A and 1B, the display device 20 according to the first embodiment includes, on the substrate 33, the active element layers forming the plurality of active elements, the flattening film 40, the first light-emitting element including the blue-light-emitting layer 5BH, the second light-emitting element including the green-light-emitting layer 5GH, the third light-emitting element including the red-light-emitting layer 5RH, and the light absorbing member 1 in the stated order from the substrate 33 side.

For the substrate 33, there may be used a glass substrate, or the like that can resist a process of forming the active element layers forming the plurality of active elements, which is a process performed at a relatively high temperature.

Examples of the material of the resin layer 34 include a polyimide resin, an epoxy resin, and a polyamide resin, but are not limited thereto.

In the case of the display device 20 according to the first embodiment, the resin layer 34 is included, and hence a flexible display device can be obtained by performing processes as described below. For example, the resin layer 34 is irradiated with a laser beam through the substrate 33 to lower a bonding force between the substrate 33 and the resin layer 34, and the substrate 33 peels off from the resin layer 34 (Laser Lift Off process (LLO process)). A flexible substrate (not illustrated) formed of PET or the like is attached on a surface of the resin layer 34 from which the substrate 33 peels off. In this manner, the flexible display device may be achieved. The resin layer 34 is irradiated with a laser beam through the substrate 33 to lower a bonding force between the substrate 33 and the resin layer 34, and the substrate 33 peels off from the resin layer 34 (Laser Lift Off process (LLO process)). The resin layer 34 is used as a substrate. In this manner, the flexible display device may be achieved.

In the present embodiment, a case where the resin layer 34 is included is given as an example. However, the resin layer 34 is not required in a case where the display device is not required to be flexible or a case where the flexible display device is achieved by a method other than the LLO process described above.

The barrier layer 35 is a layer that prevents moisture or impurities from reaching the active elements, the first light-emitting element including the blue-light-emitting layer 5BH, the second light-emitting element including the green-light-emitting layer 5GH, and the third light-emitting element including the red-light-emitting layer 5RH when the display device 20 is being used, and may be formed, for example, by the CVD, of a silicon oxide film, a silicon nitride film, or a silicon oxynitride film, or by a layered film of these.

The semiconductor film 36 is formed of low-temperature polysilicon (LTPS) or an oxide semiconductor, for example. Note that, FIG. 1B illustrates the TFT element that has a top gate structure including the semiconductor film 36 as a channel, but the TFT element may have a bottom gate structure.

The gate electrode layer GE, the capacitance electrode layer CE, and the source drain electrode layer SH are each formed of a single layer film or a layered film of metal, the metal including at least one of aluminum (Al), tungsten (W), molybdenum (Mo), tantalum (Ta), chromium (Cr), titanium (Ti), and copper (Cu), for example.

The inorganic insulating films 37, 38, and 39 may be formed, for example, by the CVD, of a silicon oxide (SiOx) film, a silicon nitride (SiNx) film, or a silicon oxynitride film, or by a layered film of these.

The flattening film (interlayer insulating film) 40 may be formed, for example, of a coatable photosensitive organic material, such as a polyimide resin and an acrylic resin.

Figure 2A:
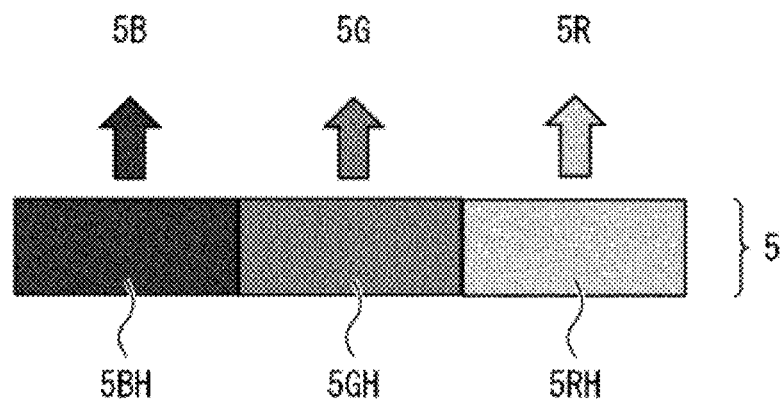
FIG. 2A is a diagram illustrating light-emitting layers of respective colors included in the display device according to the first embodiment.
Figure 2B:
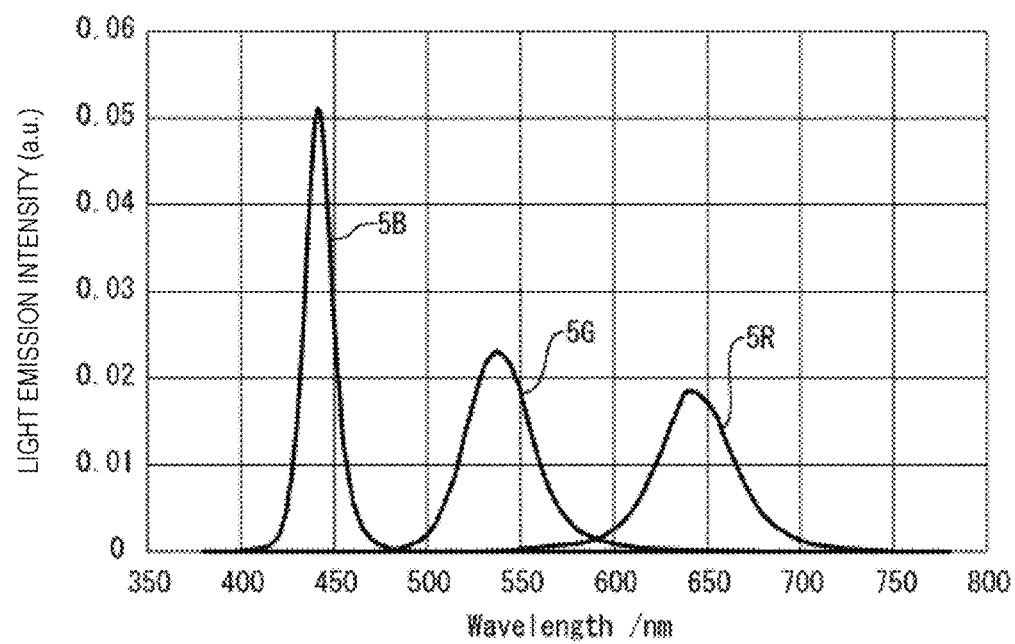
FIG. 2B is a diagram illustrating spectra of light emitted from the light-emitting layers of the respective colors included in the display device according to the first embodiment.

FIG. 2A is a diagram illustrating the blue-light-emitting layer 5BH, the green-light-emitting layer 5GH, and the red-light-emitting layer 5RH included in the display device 20 according to the first embodiment. FIG. 2B is a diagram illustrating spectra of light emitted from the blue-light-emitting layer 5BH, the green-light-emitting layer 5GH, and the red-light-emitting layer 5RH included in the display device 20 according to the first embodiment.

As illustrated in FIGS. 2A and 2B, light 5B containing a first emission peak wavelength ($\lambda_B$=445 nm) is emitted from the blue-light-emitting layer 5BH, light 5G containing a second emission peak wavelength ($\lambda_G$=540 nm) is emitted from the green-light-emitting layer 5GH, and light 5R containing a third emission peak wavelength ($\lambda_R$=640 nm) is emitted from the red-light-emitting layer 5RH.

In the present embodiment, a case where the display device 20 includes the three types of light-emitting layers 5 that emit blue, green, and red light, respectively, in other words the blue-light-emitting layer 5BH, the green-light-emitting layer 5GH, and the red-light-emitting layer 5RH is given as an example, but the present embodiment is not limited thereto. Four or more light-emitting layers that emit light of different colors may be included.

In the present embodiment, each of the blue-light-emitting layer 5BH, the green-light-emitting layer 5GH, and the red-light-emitting layer 5RH is a light-emitting layer formed of quantum dots (nanoparticles). As the quantum dots, for example, any of CdSe/CdS, CdSe/ZnS, InP/ZnS, ZnTe—ZnSe/ZnS, ZnTe—ZnS/ZnS, and CIGS/ZnS may be used. The quantum dots (nanoparticles) have a particle diameter of from approximately 2 nm to approximately 10 nm. Note that, the blue-light-emitting layer 5BH, the green-light-emitting layer 5GH, and the red-light-emitting layer 5RH may use the quantum dots (nanoparticles) having different particle diameters or use quantum dots (nanoparticles) of different types from one another so that the light-emitting layers have center wavelengths of emitted light, which are different from one another. Further, in a case of the light-emitting layers formed of non-Cd based quantum dots (nanoparticles), for example, a blue-light-emitting layer (ZnSe), a green-light-emitting layer (InP), and a red-light-emitting layer (InP), spectra of the emitted light are broad, and color purity is not satisfactory. However, by using the light-emitting layers in combination with the light absorbing member 1, the display color gamut can be broadened.

As described above, in the present embodiment, a case where the light-emitting layers formed of the quantum dots (nanoparticles) are used as the blue-light-emitting layer 5BH, the green-light-emitting layer 5GH, and the red-light-emitting layer 5RH is given as an example, but the present embodiment is not limited thereto. As the blue-light-emitting layer 5BH, the green-light-emitting layer 5GH, and the red-light-emitting layer 5RH, light-emitting layers for OLEDs may be used.

Note that, the arrangement of the blue-light-emitting layer 5BH, the green-light-emitting layer 5GH, and the red-light-emitting layer 5RH is not particularly limited. For example, side-by-side arrangement, tandem arrangement, arrangement obtained by combining a plurality of arrangement patterns, or the like may be adopted.

Figure 3A:
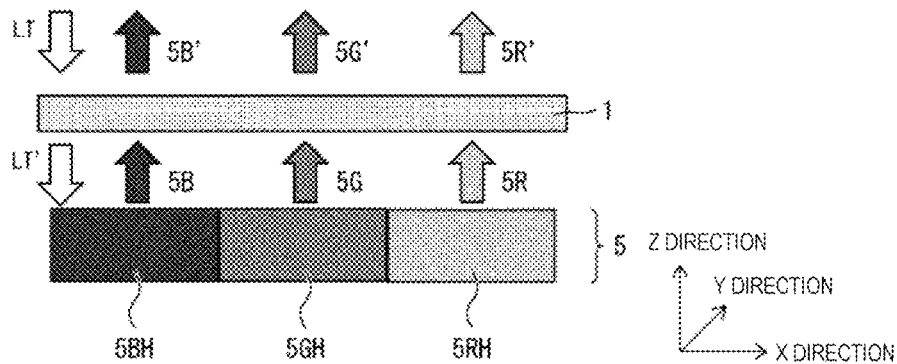
FIG. 3A is a diagram illustrating a positional relationship between a light absorbing member and the light-emitting layers of the respective colors included in the display device according to the first embodiment.
Figure 3B:
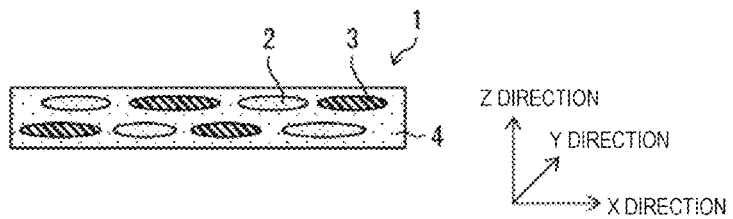
FIG. 3B is a diagram illustrating a cross section of the light absorbing member included in the display device according to the first embodiment, which is taken along a thickness direction thereof.
Figure 3C:
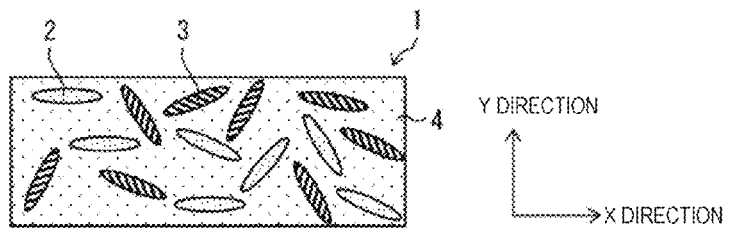
FIG. 3C is a top view of the light absorbing member included in the display device according to the first embodiment as seen from above.
Figure 3D:
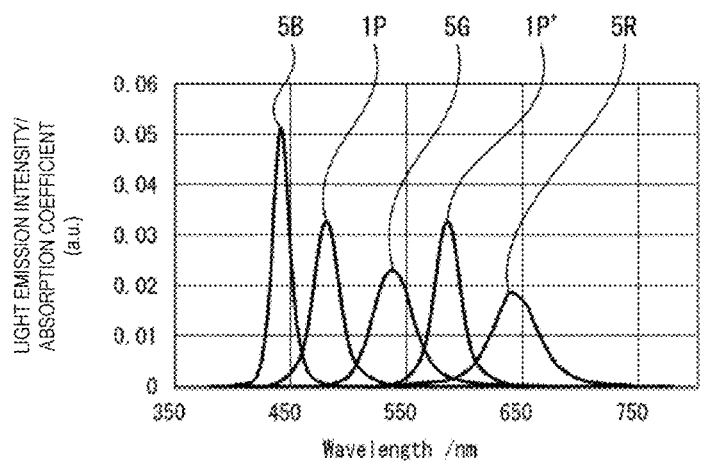
FIG. 3D is a diagram illustrating the spectra of the light emitted from the light-emitting layers of the respective colors and absorption spectra of the light absorbing member included in the display device according to the first embodiment.

FIG. 3A is a diagram illustrating a positional relationship between the blue-light-emitting layer 5BH, the green-light-emitting layer 5GH, the red-light-emitting layer 5RH, and the light absorbing member 1 included in the display device 20 according to the first embodiment. FIG. 3B is a diagram illustrating a cross section of the light absorbing member 1 included in the display device 20 according to the first embodiment, which is taken along a thickness direction (Z direction) thereof. FIG. 3C is a top view illustrating the light absorbing member 1 included in the display device 20 according to the first embodiment as seen from above. FIG. 3D is a diagram illustrating spectra of the light 5B, 5G, and 5R emitted from the blue-light-emitting layer 5BH, the green-light-emitting layer 5GH, and the red-light-emitting layer 5RH and absorption spectra 1P and 1P' of the light absorbing member 1, which are included in the display device 20 according to the first embodiment.

As illustrated in FIG. 3A, the light 5B emitted from the blue-light-emitting layer 5BH is illustrated as light 5B' after passing through the light absorbing member 1, the light 5G emitted from the green-light-emitting layer 5GH is illustrated as light 5G' after passing through the light absorbing member 1, and the light 5R emitted from the red-light-emitting layer 5RH is illustrated as light 5R' after passing through the light absorbing member 1. Meanwhile, external light LT entering the display device 20 according to the first embodiment from outside turns to external light LT' after passing through the light absorbing member 1.

As illustrated in FIG. 3B, FIG. 3C, and FIG. 3D, the light absorbing member 1 includes first dichroic dyes 2 having an absorption peak wavelength ($\lambda_1$=490 nm) between the first emission peak wavelength ($\lambda_B$=445 nm) and the second emission peak wavelength ($\lambda_G$=540 nm) and second dichroic dyes 3 having an absorption peak wavelength ($\lambda_2$=585 nm) between the second emission peak wavelength ($\lambda_G$=540 nm) and the third emission peak wavelength ($\lambda_R$=640 nm).

In the present embodiment, in a case where the blue-light-emitting layer 5BH having an emission peak wavelength of 445 nm, the green-light-emitting layer 5GH having an emission peak wavelength of 540 nm, and the red-light-emitting layer 5RH having an emission peak wavelength of 640 nm are included is given as an example, but the emission peak wavelengths of the respective light-emitting layers are not limited thereto. In the present embodiment, a case where the first dichroic dyes 2 having an absorption peak wavelength of 490 nm and the second dichroic dyes 3 having an absorption peak wavelength of 585 nm are used in conformity with the respective light-emitting layers having emission peak wavelengths of 445 nm, 540 nm, and 640 nm is given as an example, but the present embodiment is not limited thereto. The types are not particularly limited as long as the dichroic dyes have absorption peak wavelengths between the emission peak wavelengths of the respective light-emitting layers. For example, the light absorbing member 1 may have a configuration of including only the first dichroic dyes 2 or only the second dichroic dyes 3.

Note that, as the first dichroic dyes 2 and the second dichroic dyes 3, for example, azo-based dyes, anthraquinone-based dyes, quinophthalone-based dyes, dioxazine-based dyes, and the like may be used, and dyes used in a dye-based polarizer, guest-host liquid crystal, and the like may be used.

Figure 4A:
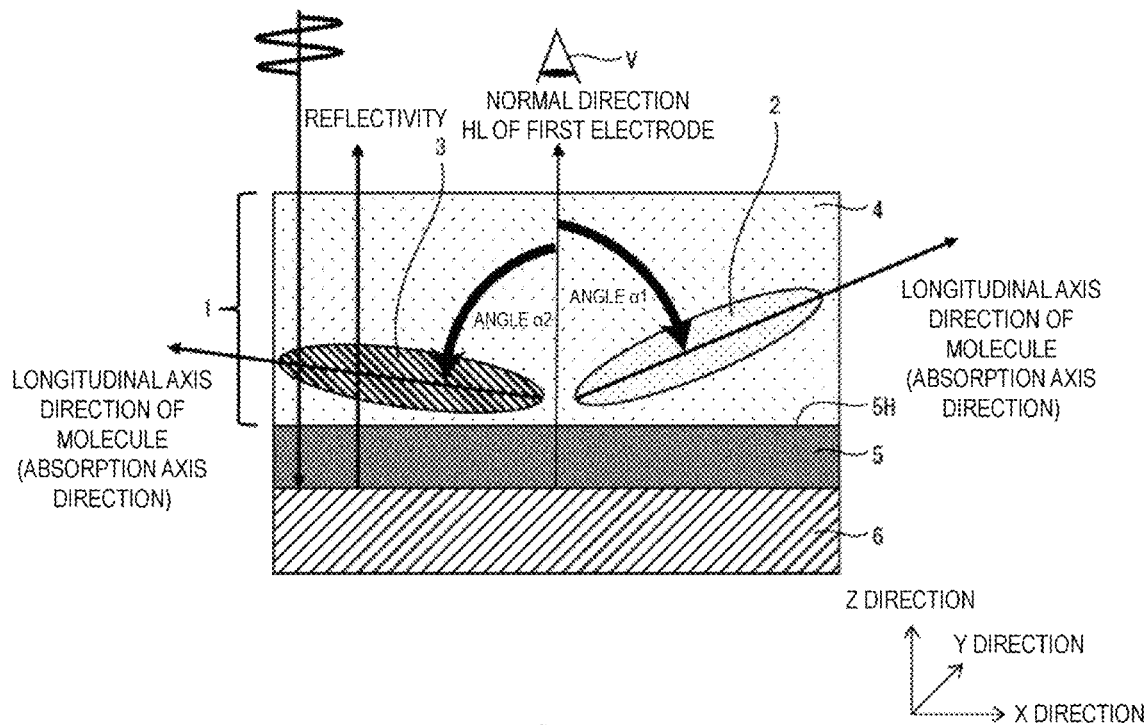
FIG. 4A is a diagram illustrating inclination angles of molecules of dichroic dyes in absorption axis directions with respect to a normal direction of the first electrode.
Figure 4B:
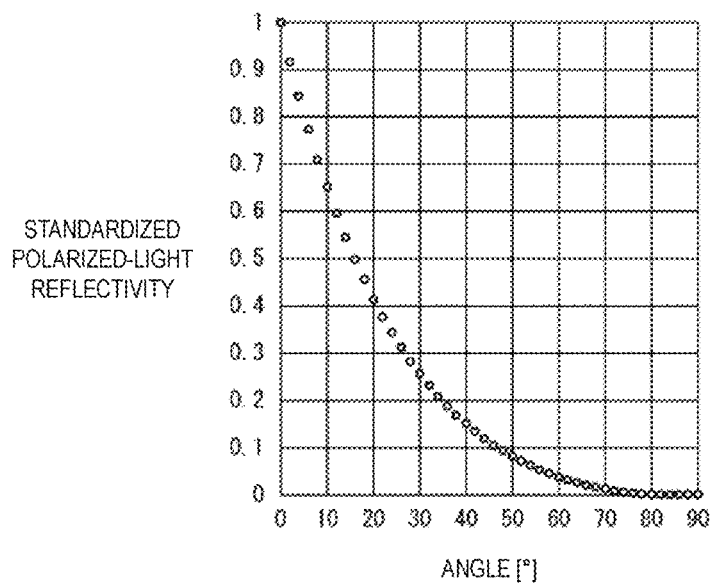
FIG. 4B is a diagram illustrating transition of standardized polarized-light reflectivity due to the inclination angles.

FIG. 4A is a diagram illustrating an inclination angle α1 of a molecule of the first dichroic dye 2 in a longitudinal axis direction (absorption axis direction) and an inclination angle α2 of a molecule of the second dichroic dye 3 in a longitudinal axis direction (absorption axis direction) with respect to a normal direction HL of the first electrode 6, which extends to a viewer V side, in other words, the normal direction HL of the first electrode 6, which extends to the light absorbing member 1 side. FIG. 4B is a diagram illustrating transition of standardized polarized-light reflectivity due to the inclination angles α1 and α2. Note that, the absorption axis directions are set so that inclination angles are 90 degrees or smaller.

FIG. 4A only illustrates the first electrode 6, the light-emitting layer 5, a light-emitting surface 5H of the light-emitting layer 5, and the light absorbing member 1 in the configuration of the display device 20 illustrated in FIG. 1A. The inclination angle of the molecule of the first dichroic dye 2 in the longitudinal axis direction with respect to the normal direction HL of the first electrode 6 is indicated with α1, and the inclination angle of the molecule of the second dichroic dye 3 in the longitudinal axis direction with respect to the normal direction HL of the first electrode 6 is indicated with α2. In this case, the reference of the inclination angles is set to the normal direction HL of the first electrode 6, but is not limited thereto. The reference of the inclination angles may be a normal direction of the light-emitting layer 5, more specifically, a normal direction of the light-emitting surface 5H of the light-emitting layer 5. Note that, the normal direction HL of the first electrode 6 and the normal direction of the light-emitting layer 5 (the normal direction of the light-emitting surface 5H of the light-emitting layer 5) substantially match with each other.

FIG. 4B is a diagram illustrating the transition of the standardized polarized-light reflectivity due to the inclination angles of the molecules of the dichroic dyes 2 and 3 in the longitudinal axis direction with respect to the normal direction HL of the first electrode 6.

As illustrated in FIG. 4A, the standardized polarized-light reflectivity is obtained by standardizing a ratio of intensity of light before entering the light absorbing member 1, which oscillates in a direction substantially parallel to the longitudinal axis direction (adsorption axis direction) of the molecule of the first dichroic dye 2 or the longitudinal axis direction (adsorption axis direction) of the molecule of the second dichroic dye 3, and intensity of light, which enters the light absorbing member 1, is reflected on the first electrode 6, and is then emitted again through the light absorbing member 1. Note that, calculation is performed with a dichroic ratio of the two dichroic dyes of 1:10, which is a ratio of an absorption coefficient in the direction with less absorption and an absorption coefficient in the direction with more absorption.

The absorption coefficients of the first dichroic dye 2 and the second dichroic dye 3 are proportional to lengths of the molecule of the first dichroic dye 2 and the molecule of the second dichroic dye 3 as seen in the normal direction HL of the first electrode 6. As illustrated in FIG. 4B, when the inclination angle $\alpha 1$ of the molecule of the first dichroic dye 2 in the longitudinal axis direction with respect to the normal direction HL of the first electrode 6 or the inclination angle $\alpha 2$ of the molecule of the second dichroic dye 3 in the longitudinal axis direction with respect to the normal direction HL of the first electrode 6 is from 70 degrees to 90 degrees, it is understood that the lengths of the molecule of the first dichroic dye 2 and the molecule of the second dichroic dye 3 as seen in the normal direction HL of the first electrode 6 are not largely changed and that there is small transition of the standardized polarized-light reflectivity.

In view of this, as illustrated in FIG. 3B, the absorption axis direction of the molecule of the first dichroic dye 2 (the longitudinal axis direction of the molecule) and the absorption axis direction of the molecule of the second dichroic dye 3 (the longitudinal axis direction of the molecule), which are included in the light absorbing member 1, are set so that the inclination angles with respect to a plane formed along an X direction and a Y direction in the drawings, in other words, the inclination angles $\alpha 1$ and $\alpha 2$ with respect to the normal direction HL of the first electrode 6, which are illustrated in FIG. 4A, are from 70 degrees to 90 degrees. The absorption axis direction of the molecule of the first dichroic dye 2 and the absorption axis direction of the molecule of the second dichroic dye 3 are more preferably orthogonal to the normal direction of the light-emitting layer 5 (the normal direction of the light-emitting surface 5H of the light-emitting layer 5), which substantially matches with the normal direction HL of the first electrode 6.

Note that, in the present embodiment, as illustrated in FIG. 4A, the case where the inclination angles $\alpha 1$ and $\alpha 2$ with respect to the normal direction HL of the first electrode 6, which is an upper direction (the direction to the viewer V side) in FIG. 4A in the absorption axis direction of the molecule of the first dichroic dye 2 and the absorption axis direction of the molecule of the second dichroic dye 3, are from 70 degrees to 90 degrees is expressed as that the angles of the absorption axis direction of the molecule of the first dichroic dye 2 and the absorption axis direction of the molecule of the second dichroic dye 3, which are formed with the normal direction of the first electrode 6, in other words, the smaller angles formed with the normal direction of the first electrode 6 are from 70 degrees to 90 degrees, in consideration of another expression described below.

The absorption axis directions of the molecules of the first dichroic dye 2 and the second dichroic dye 3 extend in the two directions (the longitudinal axis direction of the molecule (adsorption axis direction) illustrated in FIG. 4A and the direction opposite to the longitudinal axis direction of the molecule (adsorption axis direction) illustrated in FIG. 4A), and the normal direction of the first electrode 6 extends in the two directions (the upper direction in FIG. 4A (the direction to the viewer V side) and the direction opposite to the upper direction in FIG. 4A (the direction to the viewer V side)). Thus, the alignment state of the molecules of the first dichroic dye 2 and the molecule of the second dichroic dye 3 with respect to the first electrode 6 illustrated in FIG. 4A may be expressed as in the following.

The inclination angles of the molecule of the first dichroic dye 2 in the absorption axis direction and the molecule of the second dichroic dye 3 in the absorption axis direction, which are illustrated in FIG. 4A, with respect to the normal direction of the first electrode 6, which is the direction opposite to the upper direction in FIG. 4A (the direction to the viewer V side), may be expressed to be from 90 degrees to 110 degrees.

In a case where the absorption axis direction of the molecule of the first dichroic dye 2 and the absorption axis direction of the molecule of the second dichroic dye 3 are the directions opposite to the longitudinal axis direction of the molecule (adsorption axis direction) illustrated in FIG. 4A, the inclination angles with respect to the normal direction HL of the first electrode 6 being the upper direction in FIG. 4A (the direction to the viewer V side) may be expressed to be from 90 degrees to 110 degrees.

Moreover, in a case where the absorption axis direction of the molecule of the first dichroic dye 2 and the absorption axis direction of the molecule of the second dichroic dye 3 are the directions opposite to the longitudinal axis directions of the molecules (adsorption axis directions) illustrated in FIG. 4A, the inclination angles with respect to the normal direction of the first electrode 6, which is the direction opposite to the upper direction in FIG. 4A (the direction to the viewer V side), may be expressed to be from 70 degrees to 90 degrees.

In the present embodiment, in order to set the absorption axis direction of the molecule of the first dichroic dye 2 and the absorption axis direction of the molecule of the second dichroic dye 3 to be from 70 degrees to 90 degrees with respect to the normal direction HL of the first electrode 6 illustrated in FIG. 4A, a horizontal alignment film (not illustrated) is formed on a base formed of a transparent resin (not illustrated), in other words, a light-transmissive base material, and coating liquid including the first dichroic dyes 2, the second dichroic dyes 3, and a precursor of a transparent resin 4 containing a liquid crystalline monomer is applied and cured on the horizontal alignment film. In this manner, the light absorbing member 1 is produced. Note that, the curing may be thermosetting or photocuring, and thermosetting and photocuring may be performed at the same time.

With the horizontal alignment film, the liquid crystalline monomer contained in the transparent resin 4 is aligned at an angle from 70 degrees to 90 degrees with respect to the normal direction HL of the first electrode 6 illustrated in FIG. 4A. Thus, the absorption axis direction of the molecule of the first dichroic dye 2 (the longitudinal axis direction of the molecule) and the absorption axis direction of the molecule of the second dichroic dye 3 (the longitudinal axis direction of the molecule) are also aligned at angles from 70 degrees to 90 degrees with respect to the normal direction HL of the first electrode 6 illustrated in FIG. 4A. Note that, when satisfactory molecule alignment can be obtained only with the liquid crystalline monomer contained in the transparent resin 4, the horizontal alignment film may not be formed.

As illustrated in FIG. 3C, the absorption axis direction of the molecule of the first dichroic dye 2 (the longitudinal axis direction of the molecule) and the absorption axis direction of the molecule of the second dichroic dye 3 (the longitudinal axis direction of the molecule), which are included in the light absorbing member 1, are random in the plane formed along the X direction and the Y direction in the drawings. This indicates that the absorption axis direction of the molecule of the first dichroic dye 2 and the absorption axis direction of the molecule of the second dichroic dye 3, which are included in the light absorbing member 1, are random as seen in the normal direction of the light-emitting layer 5 (the normal direction of the light-emitting surface 5H of the light-emitting layer 5) that substantially matches with the normal direction HL of the first electrode 6 illustrated in FIG. 4A.

Note that, in the present embodiment, a case where the light absorbing member 1 produced separately is formed on the sealing layer 11 through intermediation of the adhesive material layer 12 is given as an example, but the present embodiment is not limited thereto. When adhesiveness between the sealing layer 11 and the light absorbing member 1 is satisfactory, the sealing layer 11 functions as a base, a horizontal alignment film (not illustrated) is formed on the sealing layer 11, and the coating liquid including the first dichroic dyes 2, the second dichroic dyes 3, and the precursor of the transparent resin 4 containing the liquid crystalline monomer is applied and cured on the horizontal alignment film. In this manner, the light absorbing member 1 may be produced. In order to control the alignment of the first dichroic dye 2, the second dichroic dye 3, and the liquid crystalline monomer, the horizontal alignment film may be independently subjected to alignment treatment. Rubbing, polarized UV irradiation, or the like may be used as such alignment treatment method, but the method is not limited thereto.

As illustrated in FIG. 3D, a difference between the second emission peak wavelength ($\lambda_G$=540 nm) of the light 5G emitted from the green-light-emitting layer 5GH and the first emission peak wavelength ($\lambda_B$=445 nm) of the light 5B emitted from the blue-light-emitting layer 5BH is preferably more than an average value of a full width half maximum of the spectrum of the light 5B emitted from the blue-light-emitting layer 5BH and a full width half maximum of the spectrum of the light 5G emitted from the green-light-emitting layer 5GH (($FWHM_B$+$FWHM_G$)/2<$\lambda_G$−$\lambda_B$). A difference between the third emission peak wavelength ($\lambda_R$=640 nm) of the light 5R emitted from the red-light-emitting layer 5RH and the second emission peak wavelength ($\lambda_G$=540 nm) of the light 5G emitted from the green-light-emitting layer 5GH is preferably more than an average value of a full width half maximum of the spectrum of the light 5G emitted from the green-light-emitting layer 5GH and a full width half maximum of the spectrum of the light 5R emitted from the red-light-emitting layer 5RH (($FWHM_G$+$FWHM_R$)/2<$\lambda_R$−$\lambda_G$).

The difference ($\lambda_G$−$\lambda_B$) between the second emission peak wavelength ($\lambda_G$=540 nm) of the light 5G emitted from the green-light-emitting layer 5GH and the first emission peak wavelength ($\lambda_B$=445 nm) of the light 5B emitted from the blue-light-emitting layer 5BH and the difference ($\lambda_R$−$\lambda_G$) between the third emission peak wavelength ($\lambda_R$=640 nm) of the light 5R emitted from the red-light-emitting layer 5RH and the second emission peak wavelength ($\lambda_G$=540 nm) of the light 5G emitted from the green-light-emitting layer 5GH are preferably 50 nm or more.

The blue-light-emitting layer 5BH, the green-light-emitting layer 5GH, and the red-light-emitting layer 5RH, which satisfy the above-mentioned conditions, the first dichroic dye 2 having the absorption peak wavelength ($\lambda_1$=490 nm) between the first emission peak wavelength ($\lambda_B$=445 nm) and the second emission peak wavelength ($\lambda_G$=540 nm), and the second dichroic dye 3 having the absorption peak wavelength ($\lambda_2$=585 nm) between the second emission peak wavelength ($\lambda_G$=540 nm) and the third emission peak wavelength ($\lambda_R$=640 nm) are used in combination. With this, the first dichroic dye 2 and the second dichroic dye 3 are prevented from absorbing the light 5B emitted from the blue-light-emitting layer 5BH, the light 5G emitted from the green-light-emitting layer 5GH, and the light 5R emitted from the red-light-emitting layer 5RH.

The difference ($\lambda_2$−$\lambda_1$) between the absorption peak wavelength ($\lambda_2$=585 nm) of the second dichroic dye 3 and the absorption peak wavelength ($\lambda_1$=490 nm) of the first dichroic dye 2 is preferably more than the full width half maximum of the spectrum of the light 5G emitted from the green-light-emitting layer 5GH ($FWHM_G$).

The blue-light-emitting layer 5BH, the green-light-emitting layer 5GH, and the red-light-emitting layer 5RH, which satisfy the above-mentioned conditions, the first dichroic dye 2 having the absorption peak wavelength ($\lambda_1$=490 nm), and the second dichroic dye 3 having the absorption peak wavelength ($\lambda_2$=585 nm) are used in combination. With this, the first dichroic dye 2 and the second dichroic dye 3 are prevented from absorbing the light 5G emitted from the green-light-emitting layer 5GH, which is recognized most brightly.

Figure 5A:
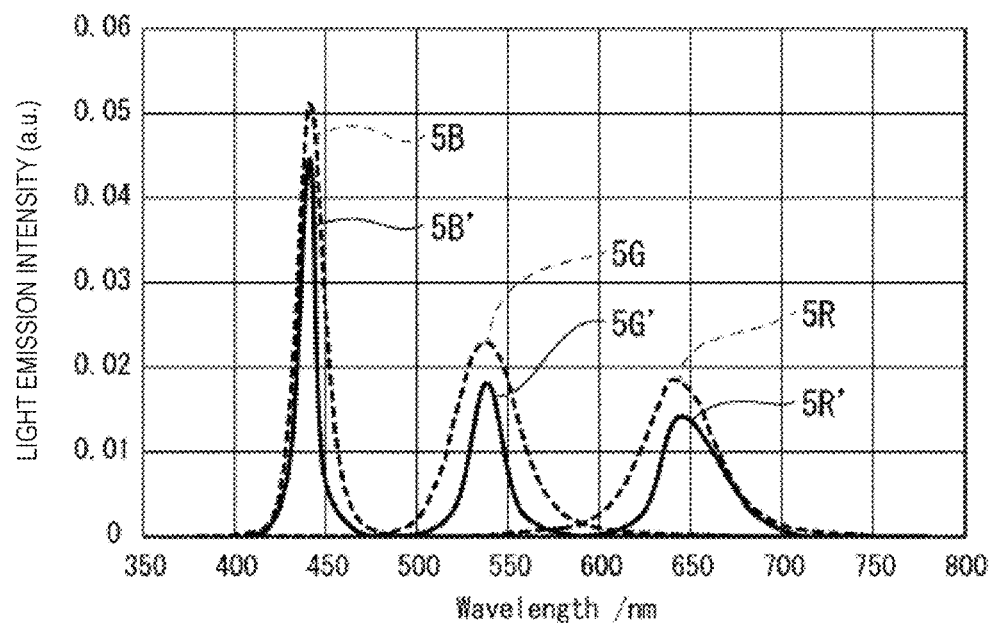
FIG. 5A is a diagram illustrating transition of the spectra of the light emitted from the light-emitting layers of the respective colors included in the display device according to the first embodiment, after passing through the light absorbing member.
Figure 5B:
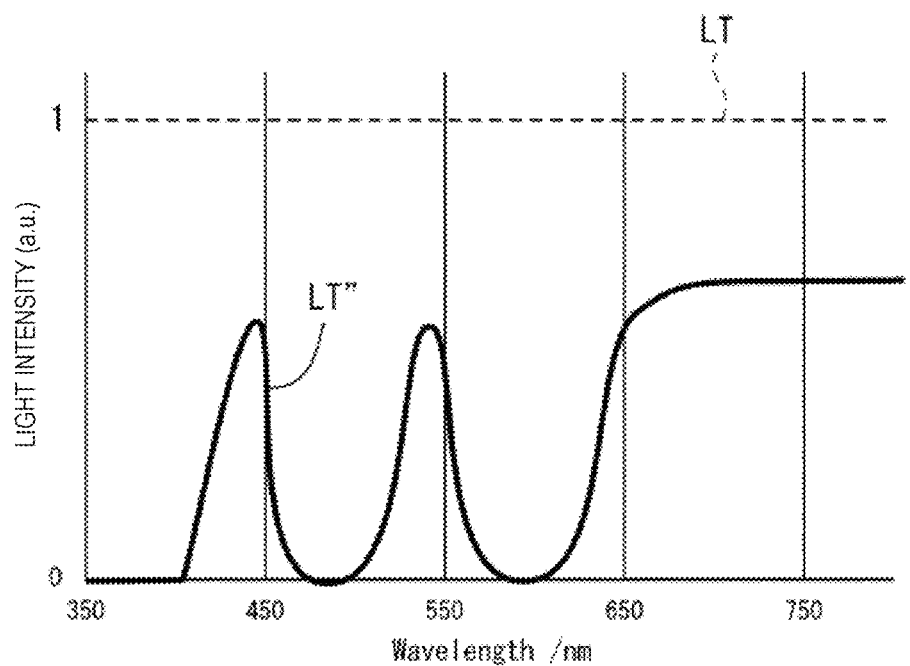
FIG. 5B is a diagram illustrating transition of a spectrum of external light entering the display device according to the first embodiment, after passing through the light absorbing member.

FIG. 5A is a diagram illustrating the transition of the spectra of the light 5B emitted from the blue-light-emitting layer 5BH, the light 5G emitted from the green-light-emitting layer 5GH, and the light 5R emitted from the red-light-emitting layer 5RH, which are included in the display device 20 according to the first embodiment, and the light 5B', the light 5G', and the light 5R' after passing through the light absorbing member 1. FIG. 5B is a diagram illustrating transition of a spectrum of the external light LT entering the display device 20 according to the first embodiment after passing through the light absorbing member 1.

As illustrated in FIG. 5A, based on the light 5B emitted from the blue-light-emitting layer 5BH, the light 5G emitted from the green-light-emitting layer 5GH, and the light 5R emitted from the red-light-emitting layer 5RH, and the light 5B', the light 5G', and the light 5R' after passing through the light absorbing member 1, it is understood that absorption of the light having the first emission peak wavelength ($\lambda_B$=445 nm), the second emission peak wavelength ($\lambda_G$=540 nm), and the third emission peak wavelength ($\lambda_R$=640 nm) by the light absorbing member 1 is smaller than absorption of the light having regions other than the first emission peak wavelength ($\lambda_B$=445 nm), the second emission peak wavelength ($\lambda_G$=540 nm), and the third emission peak wavelength ($\lambda_R$=640 nm) by the light absorbing member 1.

Therefore, drastic reduction in luminance is not caused by the light absorbing member 1.

As illustrated in FIG. 5A, the light 5B emitted from the blue-light-emitting layer 5BH turns to the light 5B' after passing through the light absorbing member 1 in such manner that light having a wavelength longer than the first emission peak wavelength ($\lambda_B$=445 nm) is absorbed by the light absorbing member 1. The light 5G emitted from the green-light-emitting layer 5GH turns to the light 5G' after passing through the light absorbing member 1 in such manner that light having a wavelength longer than and shorter than the second emission peak wavelength ($\lambda_G$=540 nm) is absorbed by the light absorbing member 1. The light 5R emitted from the red-light-emitting layer 5RH turns to the light 5R' after passing through the light absorbing member 1 in such manner that light having a wavelength shorter than the third emission peak wavelength ($\lambda_R$=640 nm) is absorbed by the light absorbing member 1.

The light having a wavelength longer than the first emission peak wavelength ($\lambda_B$=445 nm) in the light 5B emitted from the blue-light-emitting layer 5BH and the light having a wavelength shorter than the second emission peak wavelength ($\lambda_G$=540 nm) in the light 5G emitted from the green-light-emitting layer 5GH are optical components that cause degradation of color purity by color mixing, and hence, the light absorbing member 1 absorbs such optical components to improve color purity. The light having a wavelength longer than the second emission peak wavelength ($\lambda_G$=540 nm) in the light 5G emitted from the green-light-emitting layer 5GH and the light having a wavelength shorter than the third emission peak wavelength ($\lambda_R$=640 nm) in the light 5R emitted from the red-light-emitting layer 5RH are optical components that cause degradation of color purity by color mixing, and hence, the light absorbing member 1 absorbs such optical components to improve color purity.

As illustrated in FIG. 5A, the full width half maximums of the spectra of the light 5B', the light 5G', and the light 5R' after passing through the light absorbing member 1 are smaller than the full width half maximums of the spectra of the light 5B emitted from the blue-light-emitting layer 5BH, the light 5G emitted from the green-light-emitting layer 5GH, and the light 5R emitted from the red-light-emitting layer 5RH, respectively.

As illustrated in FIG. 3A, the external light LT entering the display device 20 according to the first embodiment turns to the external light LT' after passing through the light absorbing member 1 including the first dichroic dye 2 having the absorption peak wavelength ($\lambda_1$=490 nm) and the second dichroic dye 3 having the absorption peak wavelength ($\lambda_2$=585 nm). The external light LT' is reflected on the first electrode 6 having high reflectivity of visible light, and is emitted to the user side after passing through the light absorbing member 1 again.

FIG. 5B is a diagram illustrating transition of a spectrum of external light LT'' after the external light LT entering the display device 20 according to the first embodiment passes through the light absorbing member 1 twice. As illustrated, the external light LT'' after passing through the light absorbing member 1 twice is formed of light having a wavelength range other than a part of the light absorbing member 1 having the absorption spectra 1P and 1P'.

As described above, under intense external light such as intense solar light outdoors and intense illumination light indoors, for example, reflective light reflected on the first electrode 6 having high reflectivity of visible light can be suppressed with the display device 20 including the light absorbing member 1. Thus, the display device 20 having a high contrast ratio can be achieved.

In the present embodiment, an absorbent for absorbing the light having a wavelength shorter than 410 nm is mixed in the adhesive material layer 12 as a first absorbent for absorbing the light having a wavelength shorter than the first emission peak wavelength ($\lambda_B$=445 nm). Thus, as illustrated in FIG. 5B, the external light LT'' after passing through the light absorbing member 1 twice does not include an optical component having a wavelength shorter than 410 nm. Note that, the first absorbent is not particularly limited as long as it absorbs the light having a wavelength shorter than the first emission peak wavelength ($\lambda_B$=445 nm). For example, the absorbent may absorb light having a wavelength shorter than 400 nm, or may absorb light having a wavelength shorter than 360 nm.

In the present embodiment, a case where the first absorbent is mixed in the adhesive material layer 12 is given as an example, but the present embodiment is not limited thereto. The first absorbent may be included in at least one layer being an upper layer (the viewer side) to the first light-emitting element including the blue-light-emitting layer 5BH, the second light-emitting element including the green-light-emitting layer 5GH, and the third light-emitting element including the red-light-emitting layer 5RH, in other words, at least one of the sealing layer 11, the adhesive material layer 12, and the light absorbing member 1. The first absorbent may not be used.

Moreover, a second absorbent for absorbing the light having a wavelength longer than the third emission peak wavelength ($\lambda_R$=640 nm) may be included in at least one layer being an upper layer (the viewer side) to the first light-emitting element including the blue-light-emitting layer 5BH, the second light-emitting element including the green-light-emitting layer 5GH, and the third light-emitting element including the red-light-emitting layer 5RH, in other words, at least one of the sealing layer 11, the adhesive material layer 12, and the light absorbing member 1. The second absorbent may not be used.

As described above, by using the first absorbent or the second absorbent, a transmission spectrum of the light 5B emitted from the blue-light-emitting layer 5BH or a transmission spectrum of the light 5R emitted from the red-light-emitting layer 5RH is sharpened, and thus color purity can further be improved. Degradation of the display device 20 due to UV light or infrared light can be suppressed. By using the first absorbent, the display device 20 does not emit, to the user side, light having a wavelength range that is not required for display and light having a short wavelength that disadvantageously affects eyes of the user. By using the second absorbent, the display device 20 does not emit, to the user side, light having a long wavelength range that is not required for display.

A surface of the light absorbing member 1 illustrated in FIG. 1A, which is opposite to a surface facing the first light-emitting element including the blue-light-emitting layer 5BH, the second light-emitting element including the green-light-emitting layer 5GH, and the third light-emitting element including the red-light-emitting layer 5RH, in other words, a surface of the light absorbing member 1 opposite to a surface on which the adhesive material layer 12 is formed is preferably subjected to surface treatment. Note that, examples of the surface treatment include non-glare treatment, low-reflection coating, anti-fouling treatment, scratch protection, and anti-static treatment. Specifically, the surface of the light absorbing member 1 opposite to the surface on which the adhesive material layer 12 is formed is a surface having a characteristic of any of anti-reflection, anti-fouling, scratch protection, and anti-static.

FIG. 6A is a diagram for illustrating an optical absorption characteristic and the absorption axis direction of the molecule of the first dichroic dye 2. FIG. 6B is a diagram for illustrating an optical absorption characteristic and the absorption axis direction of the molecule of the second dichroic dye 3. FIG. 6C is a diagram illustrating a general polarization transmittance of a polarizing plate in a related art. FIG. 6D is a diagram illustrating a polarization transmittance of the light absorbing member 1 included in the display device 20 according to the first embodiment.

As illustrated in FIG. 6A, the absorption axis (also referred to as an absorption transition moment) direction (any one of the upper and lower directions in the drawing) of the molecule of the first dichroic dye 2 is the longitudinal axis direction of the molecule of the first dichroic dye 2. The first dichroic dye 2 has an absorption coefficient of S polarized light larger than an absorption coefficient of P polarized light. The S polarized light oscillates in a direction parallel to the absorption axis of the molecule of the first dichroic dye 2, and the P polarized light oscillates in a direction orthogonal to the absorption axis of the molecule of the first dichroic dye 2.

As illustrated in FIG. 6B, the absorption axis (also referred to as an absorption transition moment) direction (any one of the upper and lower directions in the drawing) of the molecule of the second dichroic dye 3 is the longitudinal axis direction of the molecule of the second dichroic dye 3. The second dichroic dye 3 has an absorption coefficient of the S polarized light larger than an absorption coefficient of the P polarized light. The S polarized light oscillates in a direction parallel to the absorption axis of the molecule of the second dichroic dye 3, and the P polarized light oscillates in the direction orthogonal to the absorption axis of the molecule of the first dichroic dye 2.

As illustrated in FIG. 6C, in the entire visible light wavelength range (380 nm to 680 nm), for example, the light passing through the polarizing plate in the related art has a polarization characteristic that a polarization transmittance of the S polarized light is low when a polarization transmittance of the P polarized light is high.

Meanwhile, as illustrated in FIG. 6D, the light absorbing member 1 included in the display device 20 according to the first embodiment includes the first dichroic dyes 2 having the absorption peak wavelength ($\lambda_1$=490 nm) and the second dichroic dyes 3 having the absorption peak wavelength ($\lambda_2$=585 nm), and hence a polarization transmittance of the light having a wavelength range other than the absorption wavelength in the visible light wavelength range (380 nm to 680 nm) is high.

The absorption axis direction of the molecule of the first dichroic dye 2 and the absorption axis direction of the molecule of the second dichroic dye 3 in the light absorbing member 1 are aligned at an angle from 70 degrees to 90 degrees with respect to the normal direction HL of the first electrode 6 illustrated in FIG. 4A, and are random as seen in the normal direction of the light-emitting layer 5 (the normal direction of the light-emitting surface 5H of the light-emitting layer 5) that substantially matches with the normal direction HL of the first electrode 6 illustrated in FIG. 4A. Thus, even in the corresponding absorption wavelength range of the light absorbing member 1, the P polarized light is hardly absorbed, and only the S polarized light is absorbed to a large extent.

As described above, the light emitted from the display device 20 according to the first embodiment to the user (viewer) side is non-polarized light, which includes both the P polarized light and the S polarized light, having a wavelength other than the corresponding absorption wavelength range of the light absorbing member 1. Thus, even when the user views the display device 20 through polarized sunglasses, satisfactory display can be achieved without changing a contrast between light and shade at any angle.

Second Embodiment

Next, with reference to FIG. 7, a second embodiment of the present disclosure will be described. A light absorbing member 13 included in a display device 20a according to the present embodiment is different from the first embodiment in that a first light absorbing member 13a including the first dichroic dyes 2 and a second light absorbing member 13b including the second dichroic dyes 3 are included, and the other matters are as described in the first embodiment. For convenience of description, members having the same functions as those of the members illustrated in the drawings in the first embodiment are denoted by the same reference numerals, and descriptions thereof will be omitted.

Figure 7A:
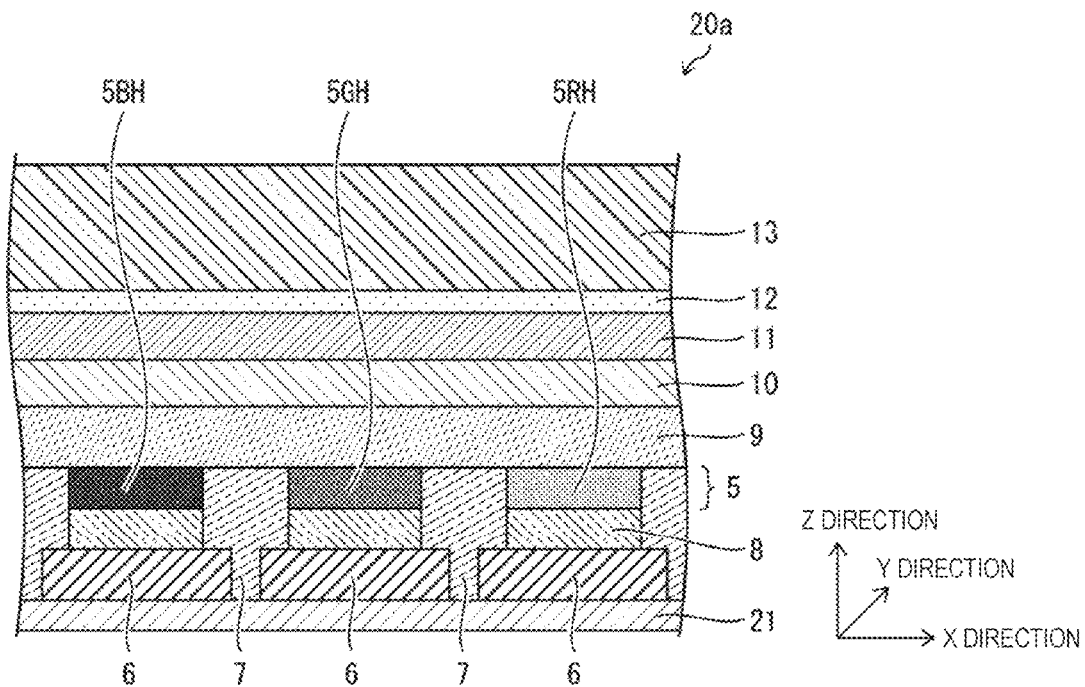
FIG. 7A is a diagram illustrating a schematic configuration of a display device according to a second embodiment.
Figure 7B:
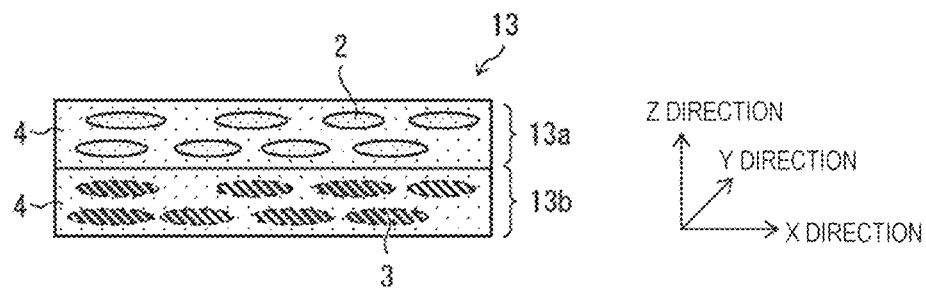
FIG. 7B is a diagram illustrating a cross section of a light absorbing member included in the display device according to the second embodiment, which is taken along a thickness direction thereof.
Figure 7C:
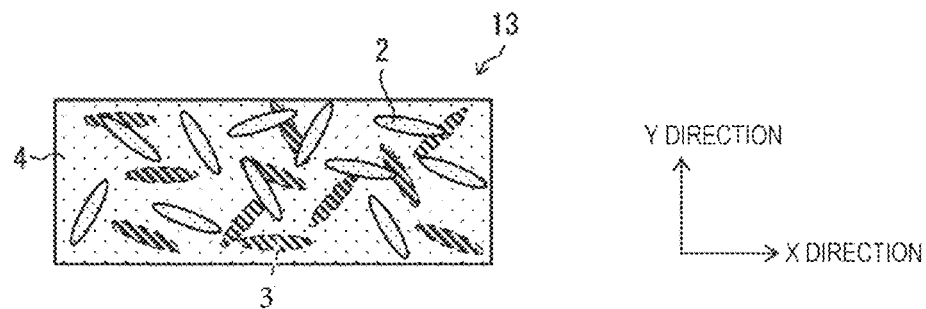
FIG. 7C is a top view of the light absorbing member included in the display device according to the second embodiment as seen from above.

FIG. 7A is a diagram illustrating a schematic configuration of a display device 20a according to the second embodiment. FIG. 7B is a diagram illustrating a cross section of the light absorbing member 13 included in the display device 20a according to the second embodiment, which is taken along a thickness direction (the Z direction in the drawing) thereof. FIG. 7C is a top view of the light absorbing member 13 included in the display device 20a according to the second embodiment as seen from above.

As illustrated in FIG. 7A, the display device 20a according to the second embodiment includes the light absorbing member 13.

As illustrated in FIG. 7B, the light absorbing member 13 includes the first light absorbing member 13a including the first dichroic dyes 2 and the second light absorbing member 13b including the second dichroic dyes 3. The absorption axis direction of the molecule of the first dichroic dye 2 (the longitudinal axis direction of the molecule) included in the first light absorbing member 13a is set so that the inclination angle with respect to the plane formed along the X direction and the Y direction in the drawings, in other words, the inclination angle $\alpha 1$ with respect to the normal direction HL of the first electrode 6 illustrated in FIG. 4A is from 70 degrees to 90 degrees. The absorption axis direction of the molecule of the first dichroic dye 2 is more preferably orthogonal to the normal direction of the light-emitting layer 5 (the normal direction of the light-emitting surface 5H of the light-emitting layer 5) that substantially matches with the normal direction HL of the first electrode 6. The absorption axis direction of the molecule of the second dichroic dye 3 (the longitudinal axis direction of the molecule) included in the second light absorbing member 13b is also set so that the inclination angle with respect to the plane formed along the X direction and the Y direction in the drawings, in other words, the inclination angle $\alpha 2$ with respect to the normal direction HL of the first electrode 6 illustrated in FIG. 4A is from 70 degrees to 90 degrees. Also the absorption axis direction of the molecule of the second dichroic dye 3 is further preferably orthogonal to the normal direction of the light-emitting layer 5 (the normal direction of the light-emitting surface 5H of the light-emitting layer 5) that substantially matches with the normal direction HL of the first electrode 6.

In the present embodiment, in order that the absorption axis direction of the molecule of the second dichroic dye 3 has the inclination angle α2 of from 70 degrees to 90 degrees with respect to the normal direction HL of the first electrode 6 illustrated in FIG. 4A, a horizontal alignment film (not illustrated) is formed on a first base formed of a transparent resin (not illustrated), in other words, a first light-transmissive base material, and coating liquid including the second dichroic dyes 3 and the precursor of the transparent resin 4 containing the liquid crystalline monomer is applied and cured on the horizontal alignment film. In this manner, the light absorbing member 13a is produced. Note that, the curing may be thermosetting or photocuring, and thermosetting and photocuring may be performed at the same time.

In the present embodiment, in order that the absorption axis direction of the molecule of the first dichroic dye 2 has the inclination angle α1 of from 70 degrees to 90 degrees with respect to the normal direction HL of the first electrode 6 illustrated in FIG. 4A, a horizontal alignment film (not illustrated) is formed on a second base formed of a transparent resin (not illustrated), in other words, a second light-transmissive base material, and coating liquid including the first dichroic dyes 2 and the precursor of the transparent resin 4 containing the liquid crystalline monomer is applied and cured on the horizontal alignment film. In this manner, the light absorbing member 13b is produced. Note that, the curing may be thermosetting or photocuring, and thermosetting and photocuring may be performed at the same time.

Note that, when satisfactory molecule alignment can be obtained only with the liquid crystalline monomer contained in the transparent resin 4, the horizontal alignment film may not be formed.

As illustrated in FIG. 7C, the absorption axis direction of the molecule of the first dichroic dye 2 (the longitudinal axis direction of the molecule) and the absorption axis direction of the molecule of the second dichroic dye 3 (the longitudinal axis direction of the molecule), which are included in the light absorbing member 13, are random in the plane formed along the X direction and the Y direction in the drawings. This indicates that the absorption axis direction of the molecule of the first dichroic dye 2 and the absorption axis direction of the molecule of the second dichroic dye 3, which are included in the light absorbing member 13, are random as seen in the normal direction of the light-emitting layer 5 (the normal direction of the light-emitting surface 5H of the light-emitting layer 5) that substantially matches with the normal direction HL of the first electrode 6 illustrated in FIG. 4A.

Note that, in the present embodiment, a case where the light absorbing member 13 produced separately is formed on the sealing layer 11 through intermediation of the adhesive material layer 12 is given as an example, but the present embodiment is not limited thereto. When adhesiveness between the sealing layer 11 and the light absorbing member 13 is satisfactory, the sealing layer 11 functions as the first base, the horizontal alignment film (not illustrated) is formed on the sealing layer 11, and the coating liquid including the second dichroic dyes 3 and the precursor of the transparent resin 4 containing the liquid crystalline monomer is applied and cured on the horizontal alignment film. In this manner, the light absorbing member 13a may be produced. Further, the light absorbing member 13a functions as the second base, the horizontal alignment film (not illustrated) is formed on the light absorbing member 13a, and the coating liquid including the first dichroic dyes 2 and the precursor of the transparent resin 4 containing the liquid crystalline monomer is applied and cured on the horizontal alignment film. In this manner, the light absorbing member 13b may be produced. The horizontal alignment film may be independently subjected to alignment treatment. Rubbing, polarized UV irradiation, or the like may be used as such alignment treatment method, but the method is not limited thereto.

The light absorbing member 13 includes the first light absorbing member 13a including the first dichroic dyes 2 and the second light absorbing member 13b including the second dichroic dyes 3, which are produced as separate members. Thus, the coating liquid including the first dichroic dyes 2 and the precursor of the transparent resin 4 containing the liquid crystalline monomer and the coating liquid including the second dichroic dyes 3 and the precursor of the transparent resin 4 containing the liquid crystalline monomer are only required to be prepared separately, and hence a selection range of solvents is widened when the two different kinds of coating liquid are produced.

In the present embodiment, as illustrated in FIG. 4A, the case where the inclination angles α1 and α2 with respect to the normal direction HL of the first electrode 6, which is an upper direction (the direction to the viewer V side) in FIG. 4A in the absorption axis direction of the molecule of the first dichroic dye 2 and the absorption axis direction of the molecule of the second dichroic dye 3, are from 70 degrees to 90 degrees is expressed as that the angles of the absorption axis direction of the molecule of the first dichroic dye 2 and the absorption axis direction of the molecule of the second dichroic dye 3, which are formed with the normal direction of the first electrode 6 (the smaller angles formed with the normal direction of the first electrode 6) are from 70 degrees to 90 degrees in consideration of the other expression described above in the first embodiment.

Third Embodiment

Next, with reference to FIG. 8, a third embodiment of the present disclosure will be described. A light absorbing member 14 included in a display device 20b according to the present embodiment further include a λ/4 retardation layer 25. The λ/4 retardation layer 25 is arranged on a side closer to the first light-emitting element including the blue-light-emitting layer 5BH, the second light-emitting element including the green-light-emitting layer 5GH, and the third light-emitting element including the red-light-emitting layer 5RH, and the absorption axis direction of the molecule of the first dichroic dye 2 and the absorption axis direction of the molecule of the second dichroic dye 3 are arranged at the angles of 45 degrees with respect to an optical axis of the λ/4 retardation layer 25. These are the differences from the first embodiment and the second embodiment, and the other matters are as described in the first embodiment and the second embodiment. For the sake of the description, members having the same functions as the members illustrated in the diagrams in the first and second embodiments are denoted by the same reference numerals, and descriptions thereof will be omitted.

Figure 8A:
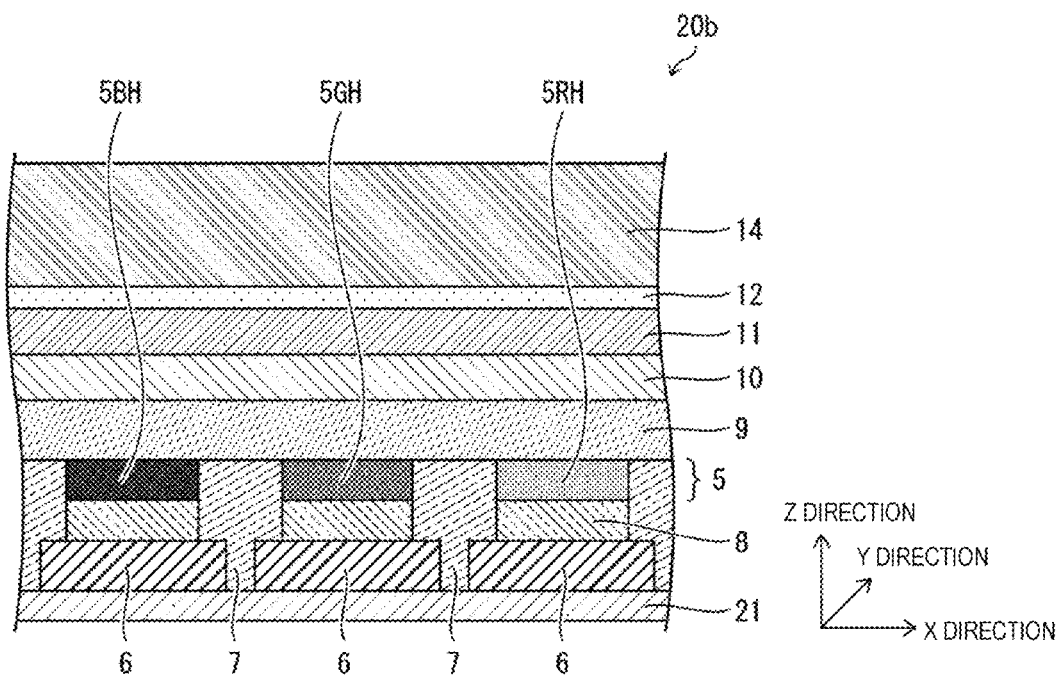
FIG. 8A is a diagram illustrating a schematic configuration of a display device according to a third embodiment.
Figure 8B:
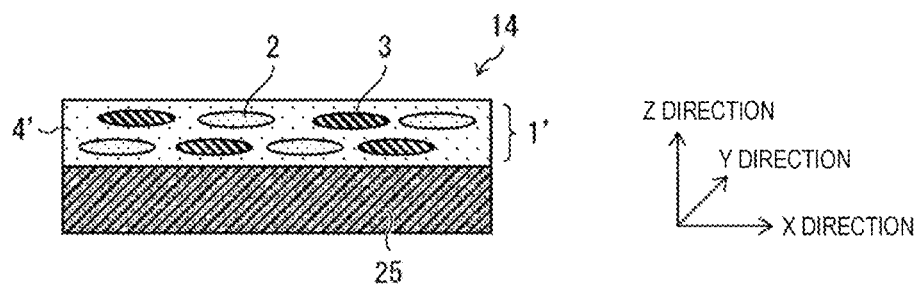
FIG. 8B is a diagram illustrating a cross section of a light absorbing member included in the display device according to the third embodiment, which is taken along a thickness direction thereof.
Figure 8C:
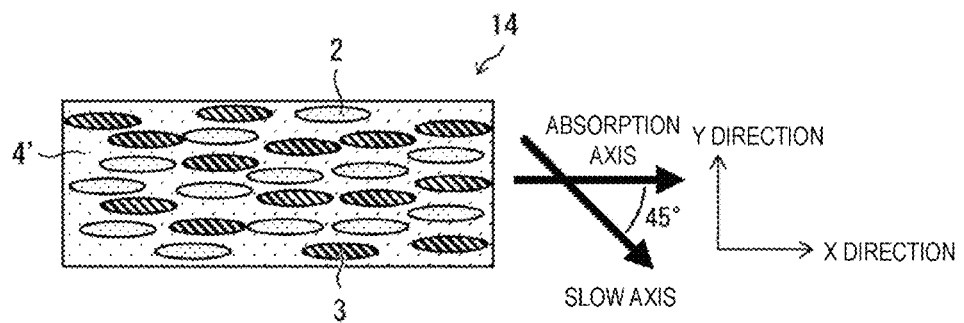
FIG. 8C is a top view of the light absorbing member included in the display device according to the third embodiment as seen from above.

FIG. 8A is a diagram illustrating a schematic configuration of the display device 20b according to the third embodiment. FIG. 8B is a diagram illustrating a cross section of the light absorbing member 14 included in the display device 20b according to the third embodiment, which is taken along a thickness direction (the Z direction in the drawing) thereof. FIG. 8C is a top view of the light absorbing member 14 included in the display device 20b according to the third embodiment as seen from above.

As illustrated in FIG. 8A, the display device 20*b* according to the third embodiment includes the light absorbing member 14.

As illustrated in FIG. 8B, the light absorbing member 14 includes the λ/4 retardation layer 25 on the side closer to the first light-emitting element including the blue-light-emitting layer 5BH, the second light-emitting element including the green-light-emitting layer 5GH, and the third light-emitting element including the red-light-emitting layer 5RH, and an extended light absorbing member 1' on the λ/4 retardation layer 25.

Coating liquid including the first dichroic dyes 2, the second dichroic dyes 3, and a precursor of a transparent resin 4' is applied and cured on the base, and then the base and the coating liquid cured on the base are extended in, for example, the right-and-left directions in the drawing so that the absorption axis direction of the molecule of the first dichroic dye 2 and the absorption axis direction of the molecule of the second dichroic dye 3 are aligned in one direction (for example, the X direction in the drawing). In this manner, the extended light absorbing member 1' can be obtained.

A case where the coating liquid including the first dichroic dyes 2, the second dichroic dyes 3, and the precursor of the transparent resin 4' is applied and cured on the base, and is extended to produce the light absorbing member 1' is described above, but the present embodiment is not limited thereto.

For example, a polyvinyl alcohol (PVA) resin is used as the transparent resin 4', and only the polyvinyl alcohol resin is extended in advance. Then, the first dichroic dye 2 and the second dichroic dye 3 are immersed in the extended polyvinyl alcohol resin, and the absorption axis direction of the molecule of the first dichroic dye 2 and the absorption axis direction of the molecule of the second dichroic dye 3 are adsorbed and aligned in parallel to PVA molecular chains. The resultant is attached on the λ/4 retardation layer 25 being a base. In this manner, the light absorbing member 14 may be formed.

Moreover, the horizontal alignment film is formed on the λ/4 retardation layer 25 being a base without performing extension, and the horizontal alignment film is independently subjected to alignment treatment so as to control alignment of the first dichroic dye 2, the second dichroic dye 3, and the liquid crystalline monomer. In this manner, the light absorbing member 14 in which the absorption axis direction of the molecule of the first dichroic dye 2 and the absorption axis direction of the molecule of the second dichroic dye 3 are aligned in one direction may be formed. Rubbing, polarized UV irradiation, or the like may be used as such alignment treatment method, but the method is not limited thereto.

The absorption axis direction of the molecule of the first dichroic dye 2 (the longitudinal axis direction of the molecule) and the absorption axis direction of the molecule of the second dichroic dye 3 (the longitudinal axis direction of the molecule), which are included in the extended light absorbing member 1', are set so that the inclination angles with respect to a plane formed along an X direction and a Y direction in the drawings, in other words, the inclination angles α1 and α2 with respect to the normal direction HL of the first electrode 6, which are illustrated in FIG. 4A, are from 70 degrees to 90 degrees. The absorption axis direction of the molecule of the first dichroic dye 2 and the absorption axis direction of the molecule of the second dichroic dye 3 are more preferably orthogonal to the normal direction of the light-emitting layer 5 (the normal direction of the light-emitting surface 5H of the light-emitting layer 5), which substantially matches with the normal direction HL of the first electrode 6.

As illustrated in FIG. 8C, the absorption axis direction of the molecule of the first dichroic dye 2 (the longitudinal axis direction of the molecule) and the absorption axis direction of the molecule of the second dichroic dye 3 (the longitudinal axis direction of the molecule), which are included in the extended light absorbing member 1', are aligned in one direction (for example, the X direction in the drawing) also in the plane formed along the X direction and the Y direction in the drawings. Specifically, the alignment is also performed in one direction as seen in the normal direction of the light-emitting layer 5 (the normal direction of the light-emitting surface 5H of the light-emitting layer 5) that substantially matches with the normal direction HL of the first electrode 6 illustrated in FIG. 4A.

As illustrated in FIG. 8C, the extended light absorbing member 1' and the λ/4 retardation layer 25 are positioned and fixed so that the absorption axis direction of the molecule of the first dichroic dye 2 and the absorption axis direction of the molecule of the second dichroic dye 3 are aligned at angles of 45 degrees with respect to the optical axis (slow axis) of the λ/4 retardation layer 25 as seen in the normal direction of the light-emitting layer 5. In this manner, the light absorbing member 14 can be manufactured.

The light absorbing member 14 can absorb the external light efficiently with the same principle of the circular polarizer. Through the extension, in the light absorbing member 14, the absorption axis direction of the molecule of the first dichroic dye 2 (the longitudinal axis direction of the molecule) and the absorption axis direction of the molecule of the second dichroic dye 3 (the longitudinal axis direction of the molecule) are aligned at angles from 70 degrees to 90 degrees with respect to the normal direction HL of the first electrode 6 illustrated in FIG. 4A, and are aligned in one direction (for example, the X direction in the drawing) as seen in the normal direction of the light-emitting layer 5 (the normal direction of the light-emitting surface 5H of the light-emitting layer 5) that substantially matches with the normal direction HL of the first electrode 6 illustrated in FIG. 4A. Thus, the horizontal alignment film, the liquid crystalline monomer, or the like is not required to be used.

In the present embodiment, as illustrated in FIG. 4A, the case where the inclination angles α1 and α2 with respect to the normal direction HL of the first electrode 6, which is an upper direction (the direction to the viewer V side) in FIG. 4A in the absorption axis direction of the molecule of the first dichroic dye 2 and the absorption axis direction of the molecule of the second dichroic dye 3, are from 70 degrees to 90 degrees is expressed as that the angles of the absorption axis direction of the molecule of the first dichroic dye 2 and the absorption axis direction of the molecule of the second dichroic dye 3, which are formed with the normal direction of the first electrode 6 (the smaller angles formed with the normal direction of the first electrode 6) are from 70 degrees to 90 degrees in consideration of the other expression described above in the first embodiment.

Fourth Embodiment

Next, with reference to FIG. 9, a fourth embodiment of the present disclosure will be described. A light absorbing member 15 included in a display device 20*c* according to the present embodiment further includes the λ/4 retardation layer 25. The λ/4 retardation layer 25 is arranged on the side closer to the first light-emitting element including the bluelight-emitting layer 5BH, the second light-emitting element including the green-light-emitting layer 5GH, and the third light-emitting element including the red-light-emitting layer 5RH, and the absorption axis direction of the molecule of the first dichroic dye 2 included a first light absorbing member 13a' that is extended and the absorption axis direction of the molecule of the second dichroic dye 3 included in second light absorbing member 13b' that is extended are aligned at angles of 45 degrees with respect to the optical axis of the λ/4 retardation layer 25. These are the differences from the third embodiment, and the other matters are as described in the third embodiment. For convenience of description, members having the same functions as those of the members illustrated in the drawings in the third embodiment are denoted by the same reference numerals, and descriptions thereof will be omitted.

Figure 9A:
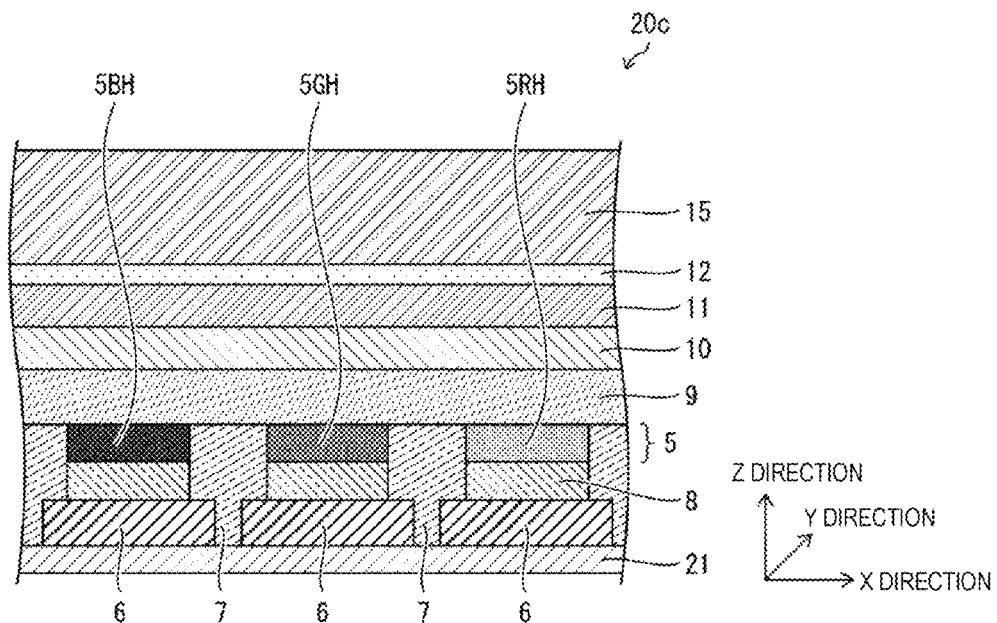
FIG. 9A is a diagram illustrating a schematic configuration of a display device according to a fourth embodiment.
Figure 9B:
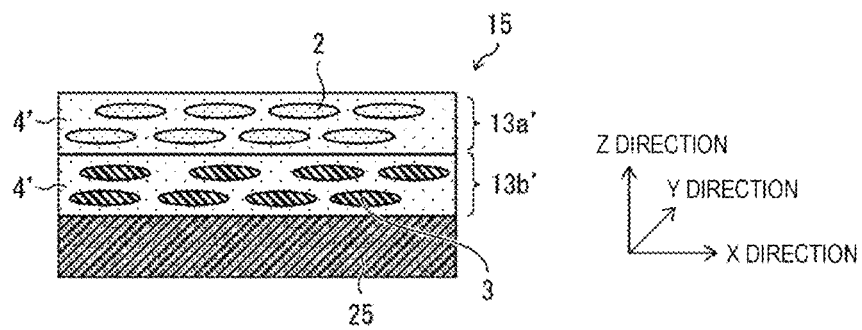
FIG. 9B is a diagram illustrating a cross section of a light absorbing member included in the display device according to the fourth embodiment, which is taken along a thickness direction thereof.
Figure 9C:
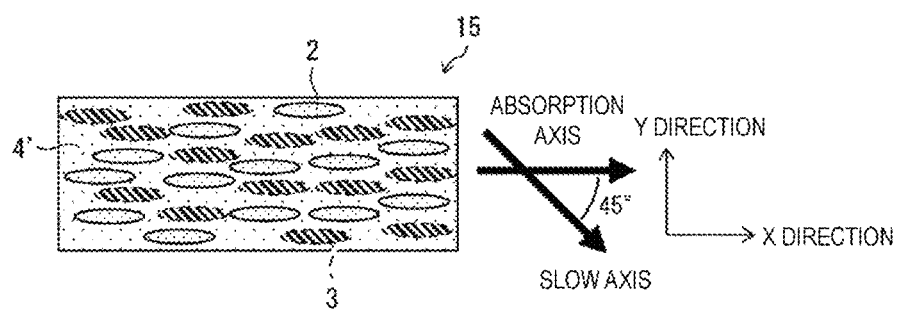
FIG. 9C is a top view of the light absorbing member included in the display device according to the fourth embodiment as seen from above.

FIG. 9A is a diagram illustrating a schematic configuration of the display device 20c according to the fourth embodiment. FIG. 9B is a diagram illustrating a cross section of the light absorbing member 15 included in the display device 20c according to the fourth embodiment, which is taken along a thickness direction (the Z direction in the drawing) thereof. FIG. 9C is a top view of the light absorbing member 15 included in the display device 20c according to the fourth embodiment as seen from above.

As illustrated in FIG. 9A, the display device 20c according to the fourth embodiment includes the light absorbing member 15.

As illustrated in FIG. 9B, the light absorbing member 15 includes the λ/4 retardation layer 25 on the side closer to the first light-emitting element including the blue-light-emitting layer 5BH, the second light-emitting element including the green-light-emitting layer 5GH, and the third light-emitting element including the red-light-emitting layer 5RH, and includes, on the λ/4 retardation layer 25, a second light absorbing member 13b' that is extended and a first light absorbing member 13a' that is extended.

Coating liquid including the first dichroic dyes 2 and the precursor of the transparent resin 4' is applied and cured on a first base, and then the first base and the coating liquid cured on the first base are extended in, for example, the right-and-left direction in the drawing so that the absorption axis direction of the molecule of the first dichroic dye 2 is aligned in one direction (for example, the X direction in the drawing). In this manner, the first light absorbing member 13a' that is extended can be obtained.

Coating liquid including the second dichroic dyes 3 and the precursor of the transparent resin 4' is applied and cured on a second base, and then the second base and the coating liquid cured on the second base are extended in, for example, the right-and-left directions in the drawing so that the absorption axis direction of the molecule of the second dichroic dye 3 is aligned in one direction (for example, the X direction in the drawing). In this manner, the second light absorbing member 13b' that is extended can be obtained.

Note that, the extension may be performed for each of the first light absorbing member 13a' or the second light absorbing member 13b', or may be performed at one time by overlapping the two light absorbing members.

The absorption axis direction of the molecule of the first dichroic dye 2 (the longitudinal axis direction of the molecule) included in the first light absorbing member 13a' that is extended and the absorption axis direction of the molecule of the second dichroic dye 3 (the longitudinal axis direction of the molecule) included in the second light absorbing member 13b' that is extended are set so that the inclination angles with respect to the plane formed along the X direction and the Y direction in the drawings, in other words, the inclination angles α1 and α2 with respect to the normal direction HL of the first electrode 6 illustrated in FIG. 4A are from 70 degrees to 90 degrees. The absorption axis direction of the molecule of the first dichroic dye 2 (the longitudinal axis direction of the molecule) and the absorption axis direction of the molecule of the second dichroic dye 3 (the longitudinal axis direction of the molecule) are more preferably orthogonal to the normal direction of the light-emitting layer 5 (the normal direction of the light-emitting surface 5H of the light-emitting layer 5) that substantially matches with the normal direction HL of the first electrode 6.

As illustrated in FIG. 9C, the absorption axis direction of the molecule of the first dichroic dye 2 (the longitudinal axis direction of the molecule) included in the first light absorbing member 13a' that is extended and the absorption axis direction of the molecule of the second dichroic dye 3 (the longitudinal axis direction of the molecule) included in the second light absorbing member 13b' that is extended are also aligned in one direction (for example, the X direction in the drawing) in the plane formed along the X direction and the Y direction in the drawing. Specifically, the alignment is also performed in one direction as seen in the normal direction of the light-emitting layer 5 (the normal direction of the light-emitting surface 5H of the light-emitting layer 5) that substantially matches with the normal direction HL of the first electrode 6 illustrated in FIG. 4A.

As illustrated in FIG. 9C, the first light absorbing member 13a' that is extended, the second light absorbing member 13b' that is extended, and the λ/4 retardation layer 25 are positioned and fixed so that the absorption axis direction of the molecule of the first dichroic dye 2 and the absorption axis direction of the molecule of the second dichroic dye 3 are aligned at angles of 45 degrees with respect to the optical axis (slow axis) of the λ/4 retardation layer 25 as seen in the normal direction of the light-emitting layer 5. In this manner, the light absorbing member 15 can be manufactured.

The light absorbing member 15 can absorb the external light efficiently with the same principle of the circular polarizer. Through the extension, in the light absorbing member 15, the absorption axis direction of the molecule of the first dichroic dye 2 (the longitudinal axis direction of the molecule) and the absorption axis direction of the molecule of the second dichroic dye 3 (the longitudinal axis direction of the molecule) are aligned at angles from 70 degrees to 90 degrees with respect to the normal direction HL of the first electrode 6 illustrated in FIG. 4A, and are aligned in one direction (for example, the X direction in the drawing) as seen in the normal direction of the light-emitting layer 5 (the normal direction of the light-emitting surface 5H of the light-emitting layer 5) that substantially matches with the normal direction HL of the first electrode 6 illustrated in FIG. 4A. Thus, the horizontal alignment film, the liquid crystalline monomer, or the like is not required to be used.

The light absorbing member 15 includes the first light absorbing member 13a' including the first dichroic dyes 2 and the second light absorbing member 13b' including the second dichroic dyes 3, which are produced as separate members. Thus, the coating liquid including the first dichroic dyes 2 and the precursor of the transparent resin 4' and the coating liquid including the second dichroic dyes 3 and the precursor of the transparent resin 4' are only required to be prepared separately, and hence a selection range of solvents is widened when the two different kinds of coating liquid are produced.

A case where the coating liquid including the first dichroic dyes 2 and the precursor of the transparent resin 4' or the coating liquid including the second dichroic dyes 3 and the precursor of the transparent resin 4' is applied and cured on the base, and is extended to produce the light absorbing member is described above, but the present embodiment is not limited thereto.

For example, a polyvinyl alcohol (PVA) resin is used as the transparent resin 4' (first resin), and only the polyvinyl alcohol resin is extended in advance. Then, the first dichroic dye 2 is immersed in the extended polyvinyl alcohol resin, and the absorption axis direction of the molecule of the first dichroic dye 2 is adsorbed and aligned in parallel to PVA molecular chains. In this manner, the first light absorbing member 13a' may be formed. A polyvinyl alcohol (PVA) resin is used as the transparent resin 4' (second resin), and only the polyvinyl alcohol resin is extended in advance. Then, the second dichroic dye 3 is immersed in the extended polyvinyl alcohol resin, and the absorption axis direction of the molecule of the second dichroic dye 3 is adsorbed and aligned in parallel to PVA molecular chains. In this manner, the second light absorbing member 13b' may be formed similarly.

Note that, the light absorbing member 15 can be manufactured by attaching the first light absorbing member 13a' and the second light absorbing member 13b' to each other and attaching any one of the first light absorbing member 13a' and the second light absorbing member 13b' on the λ/4 retardation layer 25 being a base.

Moreover, the horizontal alignment film is formed on the λ/4 retardation layer 25 being a base without performing extension, and the horizontal alignment film is independently subjected to alignment treatment so as to control alignment of the first dichroic dye 2, the second dichroic dye 3, and the liquid crystalline monomer. The coating liquid including the second dichroic dyes 3, the precursor of the transparent resin 4', and the liquid crystalline monomer is applied and cured on the base to align the second dichroic dyes 3 in one axis direction. On the resultant, the coating liquid including the first dichroic dyes 2, the precursor of the transparent resin 4', and the liquid crystalline monomer is applied and cured so as to align the first dichroic dyes 2 in parallel with the absorption axis direction of the molecules of the second dichroic dyes 3. In this manner, the formation may be performed. Note that, as needed, the coating liquid including the second dichroic dyes 3, the precursor of the transparent resin 4', and the liquid crystalline monomer may be applied and cured. After that, the horizontal alignment film may be applied and subjected to alignment treatment, and then the coating liquid including the first dichroic dyes 2, the precursor of the transparent resin 4', and the liquid crystalline monomer may be applied and cured. Rubbing, polarized UV irradiation, or the like may be used as the alignment treatment method, but the method is not limited thereto.

In the present embodiment, as illustrated in FIG. 4A, the case where the inclination angles α1 and α2 with respect to the normal direction HL of the first electrode 6, which is an upper direction (the direction to the viewer V side) in FIG. 4A in the absorption axis direction of the molecule of the first dichroic dye 2 and the absorption axis direction of the molecule of the second dichroic dye 3, are from 70 degrees to 90 degrees is expressed as that the angles of the absorption axis direction of the molecule of the first dichroic dye 2 and the absorption axis direction of the molecule of the second dichroic dye 3, which are formed with the normal direction of the first electrode 6 (the smaller angles formed with the normal direction of the first electrode 6) are from 70 degrees to 90 degrees in consideration of the other expression described above in the first embodiment.

Fifth Embodiment

Next, with reference to FIG. 10, a fifth embodiment of the present disclosure will be described. A display device 20d according to the present embodiment is different from the first embodiment to the fourth embodiment in that the light absorbing member 1 is arranged between the sealing layer (first sealing layer) 11 and a sealing layer (second sealing layer) 16, and the other matters are as described in the first embodiment to the fourth embodiment. For convenience of description, members having the same functions as those of the members illustrated in the drawings in the first to fourth embodiments are denoted by the same reference numerals, and descriptions thereof will be omitted.

Figure 10:
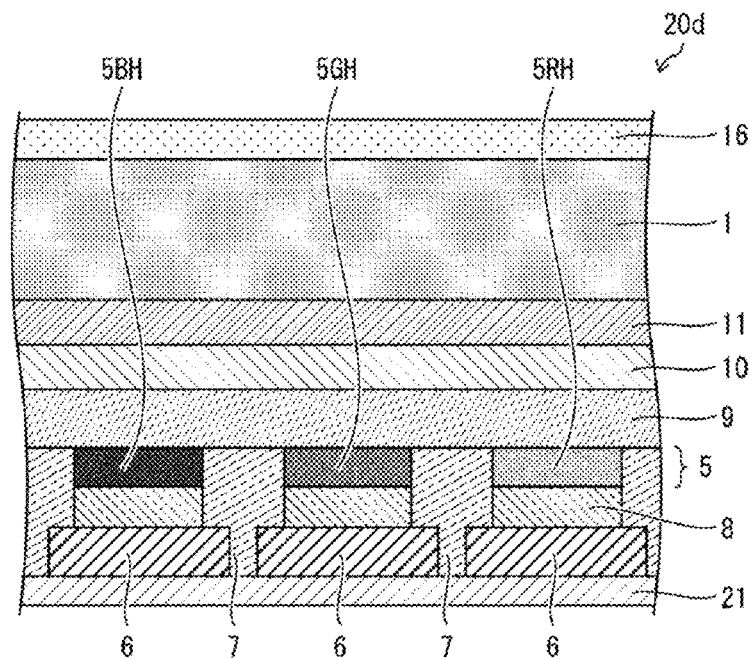
FIG. 10 is a diagram illustrating a schematic configuration of a display device according to a fifth embodiment.

FIG. 10 is a diagram illustrating a schematic configuration of the display device 20d according to the fifth embodiment.

As illustrated in FIG. 10, in the display device 20d, the light absorbing member 1 is arranged between the sealing layer (first sealing layer) 11 and the sealing layer (second sealing layer) 16.

In the present embodiment, the light absorbing member 1 is given as an example, but the present embodiment is not limited thereto. The light absorbing member 13, the light absorbing member 14, or the light absorbing member 15 may be arranged between the sealing layer (first sealing layer) 11 and the sealing layer (second sealing layer) 16.

The sealing layer 11 and the sealing layer 16 are transparent, and each may be formed of a transparent inorganic film, a transparent organic film, or a layered film formed of a transparent inorganic film and a transparent organic film.

In the present embodiment, the sealing layer 11 and the sealing layer 16 are formed of transparent inorganic films, but are not limited thereto.

With the above-mentioned configuration, the light absorbing member 1 can be protected from degradation due to moisture, oxygen, and the like.

Although not illustrated, the sealing layer (second sealing layer) 16 may be formed so as to be held in contact with an end of the light absorbing member 1 and a surface of the sealing layer (first sealing layer) 11 in a frame region on an outer side of a display region of the display device 20d. Specifically, the sealing layer 16 is formed so as to cover the light absorbing member 1 formed on the sealing layer 11.

Sixth Embodiment

Next, with reference to FIG. 11, a sixth embodiment of the present disclosure will be described. A display device 20e according to the present embodiment is different from the first embodiment in that an adhesive material layer 12a in which first nanoparticles 18 and second nanoparticles 19 are mixed is used as the adhesive material layer 12, and the other matters are as described in the first embodiment. For convenience of description, members having the same functions as those of the members illustrated in the drawings in the first embodiment are denoted by the same reference numerals, and descriptions thereof will be omitted.

Figure 11:
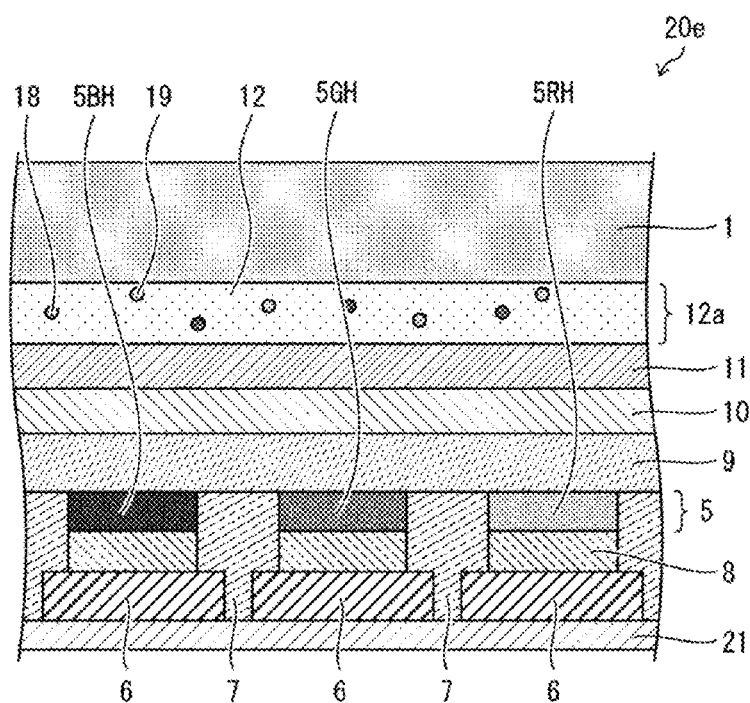
FIG. 11 is a diagram illustrating a schematic configuration of a display device according to a sixth embodiment.

FIG. 11 is a diagram illustrating a schematic configuration of the display device 20e according to the sixth embodiment.

As illustrated in FIG. 11, in the display device 20e according to the present embodiment, the adhesive material layer 12a in which the first nanoparticles 18 and the second nanoparticles 19 are mixed is used as the adhesive material layer 12.

The first nanoparticle 18 has an absorption peak wavelength ($\lambda_1$=490 nm) between the first emission peak wavelength ($\lambda_B$=445 nm) and the second emission peak wavelength ($\lambda_G$=540 nm), and the second nanoparticle 19 has an absorption peak wavelength ($\lambda_2$=585 nm) between the second emission peak wavelength ($\lambda_G$=540 nm) and the third emission peak wavelength ($\lambda_R$=640 nm).

In the present embodiment, a case where both the first nanoparticles 18 and the second nanoparticles 19 are mixed in the adhesive material layer 12 is given as an example, but the present embodiment is not limited thereto. Only one of the first nanoparticles 18 and the second nanoparticles 19 may be mixed in the adhesive material layer 12.

In the present embodiment, a case where the first nanoparticles 18 and the second nanoparticles 19 are mixed in the adhesive material layer 12 is given as an example, but the present embodiment is not limited thereto. At least one of the first nanoparticles 18 and the second nanoparticles 19 may be included in at least one layer being an upper layer (the viewer side) to the first light-emitting element including the blue-light-emitting layer 5BH, the second light-emitting element including the green-light-emitting layer 5GH, and the third light-emitting element including the red-light-emitting layer 5RH, in other words, at least one layer of the sealing layer 11, the adhesive material layer 12a, and the light absorbing member 1.

Note that, examples of the first nanoparticles 18 and the second nanoparticles 19 may include silver nanoparticles, but are not limited thereto.

The display device 20e including at least one of the first nanoparticles 18 and the second nanoparticles 19 does not scatter the external light because the first nanoparticles 18 and the second nanoparticles 19 are in a nano-size. Unnecessary external light is absorbed, and usage efficiency of the emitted light is not lowered. Thus, a higher contrast ratio can be achieved even under the external light.

Seventh Embodiment

Next, with reference to FIG. 12, a seventh embodiment of the present disclosure will be described. A display device 20f according to the present embodiment is different from the first embodiment in that the light-emitting layer (corresponding to color converting portion in the present embodiment) are caused to emit light by being irradiated with light from a light source portion. The other matters are as described in the first embodiment. For convenience of description, members having the same functions as those of the members illustrated in the drawings in the first embodiment are denoted by the same reference numerals, and descriptions thereof will be omitted.

Figure 12A:
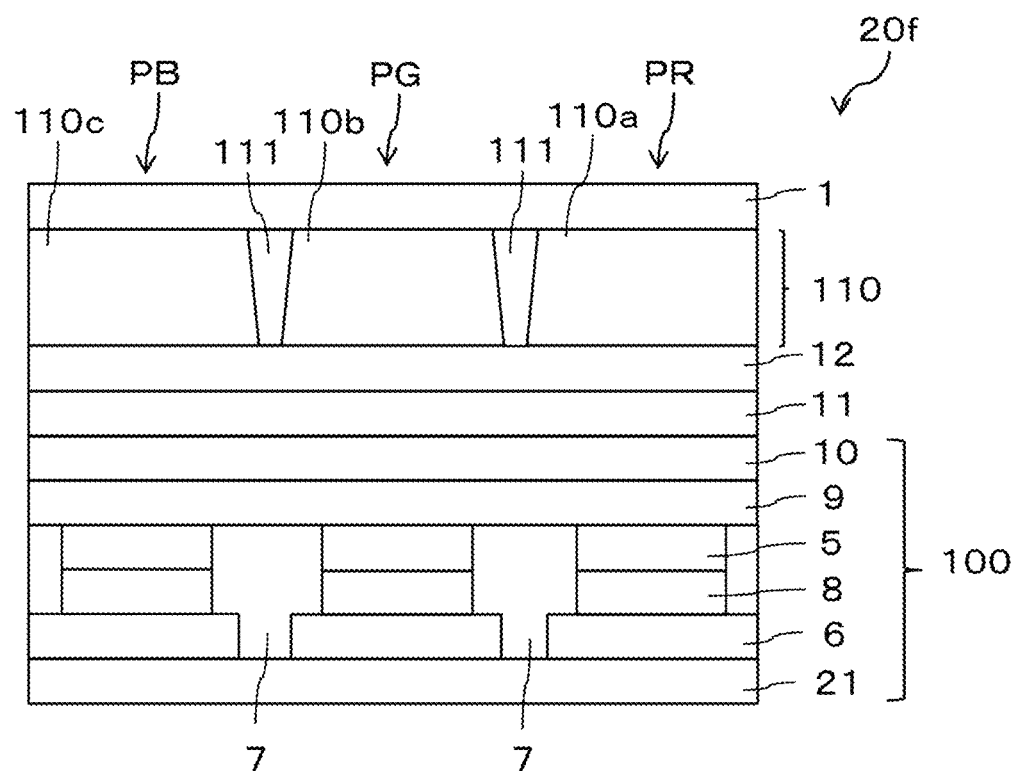
FIG. 12A is a diagram illustrating a schematic configuration of a display device according to a seventh embodiment.
Figure 12B:
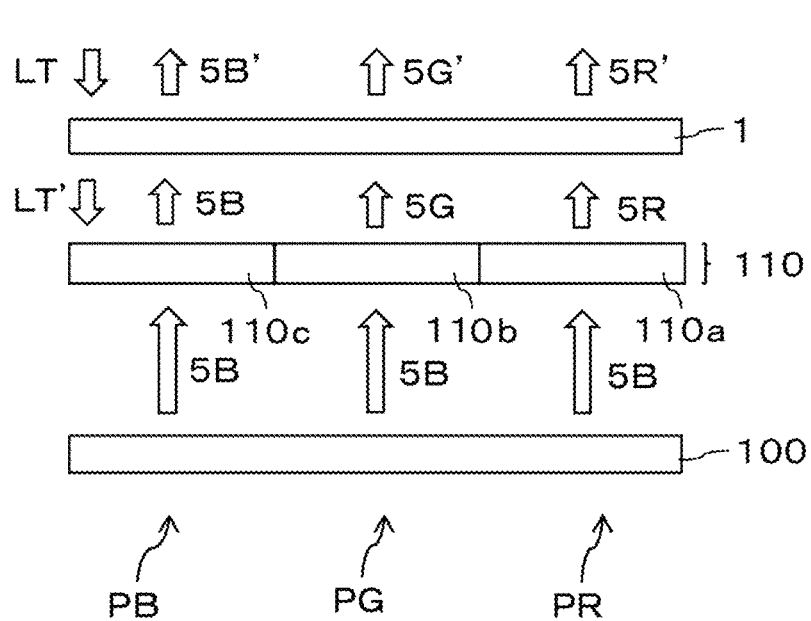
FIG. 12B is a diagram illustrating a positional relationship of a light source portion, color converting portions for the respective colors, and a light absorbing member included in the display device according to the seventh embodiment.

FIG. 12A is a diagram illustrating a schematic configuration of the display device 20f according to the seventh embodiment. FIG. 12B is a diagram illustrating a positional relationship of a light source portion 100, a color converting portion 110, and the light absorbing member 1 included in the display device 20f.

For example, as illustrated in FIG. 12A, the display device 20f according to the present embodiment includes the sealing layer 11 formed on the light source portion 100, the color converting portion 110 formed on the sealing layer 11 through intermediation of the adhesive material layer 12, and the light absorbing member 1 formed on the color converting portion 110.

The display device 20f according to the present embodiment includes a plurality of pixels arrayed in, for example, a matrix shape. The pixels include red subpixels PR for displaying a red color, green subpixels PG for displaying a green color, and blue subpixels PB for displaying a blue color. In FIG. 12, one pixel formed of one red subpixel PR, one green subpixel PG, and one blue subpixel PB is illustrated as a representative of the plurality of pixels. Each of the subpixels includes, for example, a corresponding light-emitting element and a color converting portion corresponding to each color. Note that, a description will be mainly given for each subpixel in the present embodiment, but each subpixel itself is simply referred to as a pixel in some cases. In the other embodiments, this is applied similarly.

For example, as illustrated in FIG. 12A, the light source portion 100 has a configuration obtained by replacing the second light-emitting element and the third light-emitting element in the first embodiment with light-emitting elements having a configuration similar to that of the first light-emitting element. Specifically, the light source portion 100 in the present embodiment is a source of light having the first emission peak wavelength, in other words, a light source emitting blue light. Note that, each of the light-emitting elements is formed to correspond to each of the subpixels. The first electrode 6 corresponds to a reflective layer in the light source portion 100.

For example, as illustrated in FIG. 12A, the color converting portion 110 includes a red-color converting layer (third light-emitting layer) 110a, a green-color converting layer (second light-emitting layer) 110b, and a filling layer 110c, which are partitioned by banks 111 corresponding to the subpixels, respectively. For example, the red-color converting layer 110a includes quantum dots for converting the light from the light source portion 100 to red light (the light having the third emission peak wavelength). For example, the green-color converting layer 110b includes quantum dots for converting the light from the light source portion 100 to green light (the light having the second emission peak wavelength). For example, the filling layer 110c allows the light from the light source portion 100, in other words, blue light to pass therethrough. In other words, the color converting portion 110 in the present embodiment converts the light from the light source portion 100 to the red light (for example, the light having the third emission peak wavelength), the green light (for example, the light having the second emission peak wavelength), and the blue light (for example, the light having the first emission peak wavelength). For example, the banks 111 are preferably configured so as not to allow the light to pass therethrough.

As illustrated in FIG. 12B, a color of the light 5B emitted from the light source portion 100 is converted in each of the subpixels in the color converting portion 110.

More specifically, in the red subpixel PR, the light 5B emitted from the light source portion 100 turns to the light 5R after passing though the red-color converting layer 110a. Further, after passing through the light absorbing member 1, the light 5R turns to the light 5R'.

In the green subpixel PG, the light 5B emitted from the light source portion 100 turns to the light 5G after passing through the green-color converting layer 110b. Moreover, after passing through the light absorbing member 1, the light 5G turns to the light 5G'.

In the blue subpixel PB, the light 5B emitted from the light source portion 100 passes through the filling layer 110c. Moreover, after passing through the light absorbing member 1, the light 5G passing through the filling layer 110c turns to the light 5B'.

The external light LT entering the display device 20f according to the present embodiment from outside turns to the external light LT' after passing through the light absorbing member 1. The external light LT' is reflected on the first electrode 6 having high reflectivity of visible light, which is provided to the light source portion 100, and is emitted to the user side after passing through the light absorbing member 1 again. Similarly to the first embodiment, with the display device 20f according to the present embodiment, under intense external light such as intense solar light outdoors and intense illumination light indoors, for example, the first electrode 6 having high reflectivity of visible light can suppress reflected light, and hence a contrast ratio can be higher.

For example, the display device 20f according to the present embodiment can be manufactured by attaching the light source portion 100 in which the sealing layer 11 is formed and the color converting portion 110 formed in advance to each other with the adhesive material layer 12. Note that, the light absorbing member 1 may be provided before the light source portion 100 and the color converting portion 110 are attached to each other or after the attachment.

For example, the configuration of the present embodiment is obtained by changing from the configuration in which the light-emitting layer emits light by applying a voltage between the first electrode and the second electrode in the first embodiment and replacing the configuration of emitting light by applying a voltage between the first electrode and the second electrode with the configuration in which the light-emitting layer (the color converting layer) emits light by being irradiated with the light from the light source portion. Therefore, the configuration of the present embodiment can also obtain the similar effects as in the first embodiment by, for example, providing the light absorbing member 1.

Figure 13:
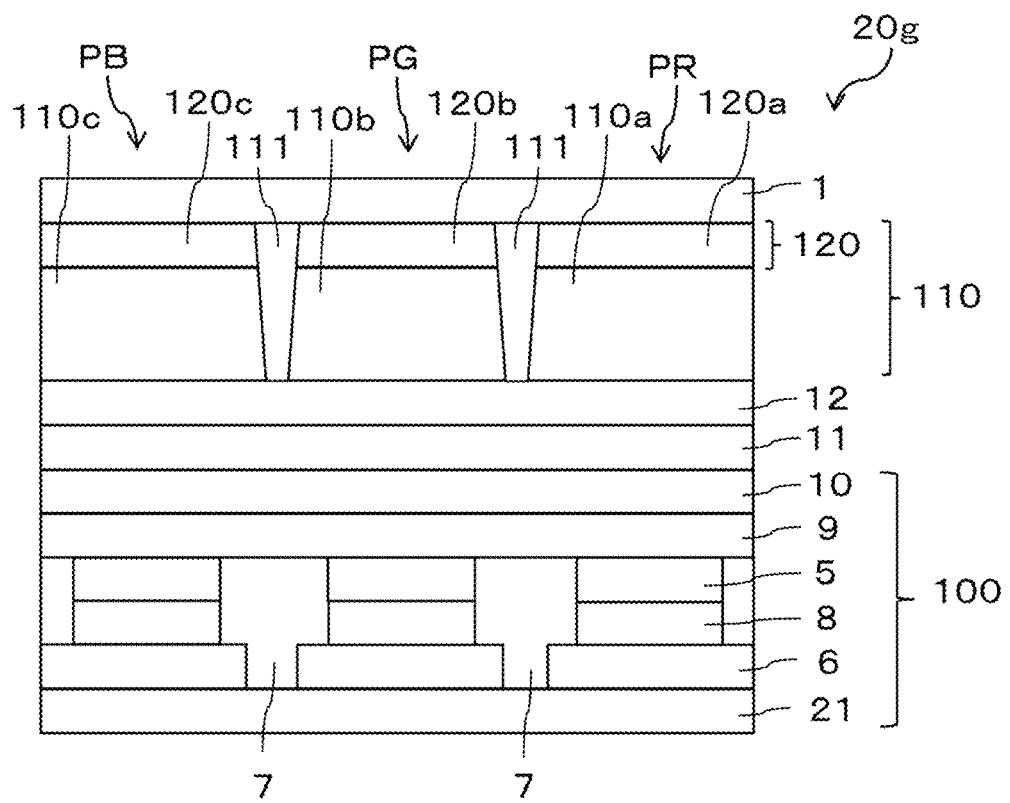
FIG. 13 is a diagram illustrating a schematic configuration of a display device in a modified example of the seventh embodiment.

Note that, for example, as in a display device 20g illustrated in FIG. 13, the display device 20f according to the seventh embodiment may further include a color filter layer 120. In the display device 20g, the color converting portion 110 includes the color filter layer 120 provided between the color converting portion 110 and the light absorbing member 1. The color filter layer 120 includes a red-color filter layer 120a that corresponds to the subpixel PR and allows the red light to pass therethrough, a green-color filter layer 120b that corresponds to the subpixel PG and allows the green light to pass therethrough, and a blue-color filter layer 120c that corresponds to the subpixel PB and allows the blue light to pass therethrough. For example, those color filter layers 120a, 120b, and 120c are partitioned by the banks 111. In other words, the color filter layers 120a, 120b, and 120c preferably cut light having wavelengths other than the wavelengths (the colors) corresponding to the subpixels. In this case, the light source portion 100 may be a light source that emits, for example, white light including blue light, red light, and green light instead of the blue light.

Moreover, in a case where the light source portion 100 emits the blue light, the blue-color filter layer 120c in the above-mentioned color filter layer 120 may be configured to allow the blue light to pass therethrough, for example.

Supplement
First Aspect
A display device including:
a base;
a first light-emitting element including a first light-emitting layer having a first emission peak wavelength;
a second light-emitting element including a second light-emitting layer having a second emission peak wavelength longer than the first emission peak wavelength;
a third light-emitting element including a third light-emitting layer having a third emission peak wavelength longer than the second emission peak wavelength,
wherein on the substrate, active element layers forming a plurality of active elements, the first light-emitting element, the second light-emitting element, the third light-emitting element, and a light absorbing member are provided in the stated order from the substrate side,
each of the first light-emitting element, the second light-emitting element, and the third light-emitting element includes a first electrode, a second electrode, and any one corresponding light-emitting layer of the first light-emitting layer, the second light-emitting layer, and the third light-emitting layer that is formed between the first electrode and the second electrode,
the light absorbing member includes at least a first dichroic dye and a second dichroic dye,
the first dichroic dye has an absorption peak wavelength between the first emission peak wavelength and the second emission peak wavelength,
the second dichroic dye has an absorption peak wavelength between the second emission peak wavelength and the third emission peak wavelength, and
an angle of a molecule of the first dichroic dye in an absorption axis direction and an angle of a molecule of the second dichroic dye in an absorption axis direction with respect to a normal direction of the first electrode are from 70 degrees to 90 degrees.

Second Aspect
The display device of the first aspect, wherein the absorption axis direction of the molecule of the first dichroic dye and the absorption axis direction of the molecule of the second dichroic dye are orthogonal to a normal direction of each of the first light-emitting layer, the second light-emitting layer, and the third light-emitting layer.

Third Aspect
The display device of the first aspect or the second aspect, wherein the absorption axis direction of the molecule of the first dichroic dye and the absorption axis direction of the molecule of the second dichroic dye are random as seen in the normal direction of each of the first light-emitting layer, the second light-emitting layer, and the third light-emitting layer.

Fourth Aspect
The display device of the first aspect or the second aspect,
wherein the light absorbing member further includes a λ/4 retardation layer,
the λ/4 retardation layer is arranged on a side closer to the first light-emitting element, the second light-emitting element, and the third light-emitting element, and
the absorption axis direction of the molecule of the first dichroic dye and the absorption axis direction of the molecule of the second dichroic dye are aligned at an angle of 45 degrees with respect to an optical axis of the λ/4 retardation layer as seen in the normal direction of each of the first light-emitting layer, the second light-emitting layer, and the third light-emitting layer.

Fifth Aspect
The display device according to any one of the first aspects to the fourth aspects,
wherein a difference between the second emission peak wavelength and the first emission peak wavelength is more than an average value of a full width half maximum of a spectrum of light emitted from the first light-emitting layer and a full width half maximum of a spectrum of light emitted from the second light-emitting layer, and a difference between the third emission peak wavelength and the second emission peak wavelength is more than an average value of the full width half maximum of the spectrum of the light emitted from the second light-emitting layer and a full width half maximum of a spectrum of light emitted from the third light-emitting layer.

Sixth Aspect

The display device of any one of the first aspect to the fifth aspect, wherein a difference between the absorption peak wavelength of the second dichroic dye and the absorption peak wavelength of the first dichroic dye is more than the full width half maximum of the spectrum of the light emitted from the second light-emitting layer.

Seventh Aspect

The display device of any one of the first aspect to the sixth aspect, wherein the difference between the second emission peak wavelength and the first emission peak wavelength and the difference between the third emission peak wavelength and the second emission peak wavelength are equal to or more than 50 nm.

Eighth Aspect

The display device of any one of the first aspect to the seventh aspect, wherein the light absorbing member includes a first light absorbing member and a second light absorbing member, the first light absorbing member includes the first dichroic dye, and the second light absorbing member includes the second dichroic dye.

Ninth Aspect

The display device of any one of the first aspect to the eighth aspect, wherein a first sealing layer is provided between the light absorbing member, and the first light-emitting element, the second light-emitting element, and the third light-emitting element.

Tenth Aspect

The display device of any one of the first aspect to the ninth aspect, wherein a second sealing layer is provided to the light absorbing member on a side opposite to a side to which the first light-emitting element, the second light-emitting element, and the third light-emitting element are provided.

Eleventh Aspect

The display device of any one of the first aspect to the eighth aspect, wherein a first sealing layer is provided between the light absorbing member, and the first light-emitting element, the second light-emitting element, and the third light-emitting element, a second sealing layer is provided to the light absorbing member on a side opposite to a side to which the first light-emitting element, the second light-emitting element, and the third light-emitting element are provided, the first sealing layer and the second sealing layer are inorganic films, and the second sealing layer is held in contact with an end of the light absorbing member and in contact with a surface of the first sealing layer in a frame region.

Twelfth Aspect

The display device of any one of the first aspect to the eleventh aspect, wherein at least one layer on a viewer side to the first light-emitting element, the second light-emitting element, and the third light-emitting element includes at least one of a first nanoparticle and a second nanoparticle, the first nanoparticle having an absorption peak wavelength between the first emission peak wavelength and the second emission peak wavelength, the second nano particle having an absorption peak wavelength between the second emission peak wavelength and the third emission peak wavelength.

Thirteenth Aspect

The display device of the twelfth aspect, wherein at least one layer on the viewer side to the first light-emitting element, the second light-emitting element, and the third light-emitting element is an adhesive material layer provided to the light absorbing member or the light absorbing member on a side to which the first light-emitting element, the second light-emitting element, and the third light-emitting element are provided.

Fourteenth Aspect

The display device of any one of the first aspect to the thirteenth aspect, wherein at least one layer on the viewer side to the first light-emitting element, the second light-emitting element, and the third light-emitting element includes a first absorbent configured to absorb light having a wavelength shorter than the first emission peak wavelength.

Fifteenth Aspect

The display device of the fourteenth aspect, wherein at least one layer on the viewer side to the first light-emitting element, the second light-emitting element, and the third light-emitting element is an adhesive material layer provided to the light absorbing member or the light absorbing member on a side to which the first light-emitting element, the second light-emitting element, and the third light-emitting element are provided.

Sixteenth Aspect

The display device of any one of the first aspect to the fifteenth aspect, wherein at least one layer on the viewer side to the first light-emitting element, the second light-emitting element, and the third light-emitting element includes a second absorbent configured to absorb light having a wavelength longer than the third emission peak wavelength.

Seventeenth Aspect

The display device of the sixteenth aspect, wherein at least one layer on the viewer side to the first light-emitting element, the second light-emitting element, and the third light-emitting element is an adhesive material layer provided to the light absorbing member or the light absorbing member on a side to which the first light-emitting element, the second light-emitting element, and the third light-emitting element are provided.

Eighteenth Aspect

The display device of any one of the first aspect to the seventeenth aspect, wherein a surface of the light absorbing member on a side opposite to a surface facing the first light-emitting element, the second light-emitting element, and the third light-emitting element is a surface having a characteristic of any of anti-reflection, anti-fouling, scratch protection, and anti-static.

Nineteenth Aspect

The display device of any one of the first aspect to the eighteenth aspect, wherein the first light-emitting layer, the second light-emitting layer, and the third light-emitting layer are light-emitting layers including quantum dots.

Twentieth Aspect

A method of manufacturing a display device, the display device configured to emit light having a first emission peak wavelength, a second emission peak wavelength longer than the first emission peak wavelength, and a third emission peak wavelength longer than the second emission peak wavelength, the method including:

forming a light-emitting layer forming:
a first light-emitting layer configured to emit light having the first emission peak wavelength;
a second light-emitting layer configured to emit light having the second emission peak wavelength; and
a third light-emitting layer configured to emit light having the third emission peak wavelength; and
forming a light absorbing member including:
a first dichroic dye having an absorption peak wavelength between the first emission peak wavelength and the second emission peak wavelength;
a second dichroic dye having an absorption peak wavelength between the second emission peak wavelength and the third emission peak wavelength; and
a resin.

Twenty-First Aspect

A method of manufacturing a display device, the display device configured to emit light having a first emission peak wavelength, a second emission peak wavelength longer than the first emission peak wavelength, and a third emission peak wavelength longer than the second emission peak wavelength, the method including:
forming a light-emitting layer forming:
a first light-emitting layer configured to emit light having the first emission peak wavelength;
a second light-emitting layer configured to emit light having the second emission peak wavelength; and
a third light-emitting layer configured to emit light having the third emission peak wavelength;
forming a first light absorbing member including:
a first dichroic dye having an absorption peak wavelength between the first emission peak wavelength and the second emission peak wavelength; and
a first resin; and
forming a second light absorbing member including:
a second dichroic dye having an absorption peak wavelength between the second emission peak wavelength and the third emission peak wavelength; and
a second resin.

Twenty-Second Aspect

The method of manufacturing a display device of the twentieth aspect, wherein, during forming the light absorbing member, coating liquid including the first dichroic dye, the second dichroic dye, and a precursor of the resin is applied and cured on a base.

Twenty-Third Aspect

The method of manufacturing a display device of the twenty-first aspect,
wherein during forming the first light absorbing member, first coating liquid including the first dichroic dye and a precursor of the first resin is applied and cured on a first base, and
during forming the second light absorbing member, second coating liquid including the second dichroic dye and a precursor of the second resin is applied and cured on a second base.

Twenty-Fourth Aspect

The method of manufacturing a display device of the twenty-second aspect or the twenty-third aspect, wherein the light absorbing member further contains liquid crystalline monomers.

Twenty-Fifth Aspect

The method of manufacturing a display device of any one of the twenty-second aspect to the twenty-fourth aspect, wherein a horizontal alignment film is formed on the base before applying and curing the coating liquid on the base.

Twenty-Sixth Aspect

The method of manufacturing a display device of the twenty-fourth aspect,
wherein a horizontal alignment film is formed on the base before applying and curing the coating liquid on the base, and
a surface of the horizontal alignment film is subjected to surface treatment to array the liquid crystalline monomers in one axis direction.

Twenty-Seventh Aspect

The method of manufacturing a display device of the twenty-second aspect,
wherein the base is a light-transmissive base material, and
during forming the light absorbing member, after applying and curing, on the light-transmissive base material, the coating liquid in which the first dichroic dye, the second dichroic dye, and the precursor of the resin are mixed, the light-transmissive base material and the coating liquid cured on the light-transmissive base material are extended to align the absorption axis direction of the molecule of the first dichroic dye and the absorption axis direction of the molecule of the second dichroic dye in one direction.

Twenty-Eighth Aspect

The method of manufacturing a display device of the twenty-third aspect, wherein, after applying and curing the first coating liquid on the first base and applying and curing the second coating liquid on the second base, the first light absorbing member and the second light absorbing member are formed by extending the first coating liquid and the second coating liquid that are cured, to align the absorption axis direction of the molecule of the first dichroic dye and the absorption axis direction of the molecule of the second dichroic dye on one direction.

Twenty-Ninth Aspect

The method of manufacturing a display device of the twenty-third aspect,
wherein the first base is a first light-transmissive base material,
the second base is a second light-transmissive base material,
after applying and curing the first coating liquid on the first light-transmissive base material, the first light absorbing member is formed by extending the first light-transmissive base material and the first coating liquid cured on the first light-transmissive base material, to align the absorption axis direction of the molecule of the first dichroic dye in one direction, and
after applying and curing the second coating liquid on the second light-transmissive base material, the second light absorbing member is formed by extending the second light-transmissive base material and the second coating liquid cured on the second light-transmissive base material, to align the absorption axis direction of the molecule of the second dichroic dye in the one direction.

Thirtieth Aspect

The method of manufacturing a display device of the twentieth aspect,
wherein the forming the light absorbing member includes;
extending the resin to align, in one direction, the absorption axis direction of the molecule of the first dichroic dye and the absorption axis direction of the molecule of the second dichroic dye that are immersed later;
immersing the first dichroic dye and the second dichroic dye in the resin that is extended; and
attaching the resin in which the first dichroic dye and the second dichroic dye are immersed to the base being a light-transmissive base material.

Thirty-First Aspect

The method of manufacturing a display device of the twenty-first aspect,
wherein the forming the first light absorbing member and the forming the second light absorbing member include
extending the first resin to align, in one direction, the absorption axis direction of the molecule of the first dichroic dye to be immersed later,
immersing the first dichroic dye in the first resin that is extended,
extending the second resin to align, in the one direction, the absorption axis direction of the molecule of the second dichroic dye to be immersed later,
immersing the second dichroic dye in the second resin that is extended,
attaching the first resin in which the first dichroic dye is immersed and the second resin in which the second dichroic dye is immersed, to each other, and
attaching any one of the first resin in which the first dichroic dye is immersed and the second resin in which the second dichroic dye is immersed and the base being a light-transmissive base material, to each other.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

INDUSTRIAL APPLICABILITY

The present disclosure can be utilized for a display device and a method for manufacturing the display device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A display device comprising:
a first light-emitting layer having a first emission peak wavelength;
a second light-emitting layer having a second emission peak wavelength longer than the first emission peak wavelength;
a third light-emitting layer having a third emission peak wavelength longer than the second emission peak wavelength;
a reflective layer configured to reflect light, the reflective layer being provided as a lower layer to the first light-emitting layer, the second light-emitting layer, and the third light-emitting layer; and
a light absorbing member including at least one kind selected from a first dichroic dye and a second dichroic dye, the light absorbing member being provided as an upper layer to the first light-emitting layer, the second light-emitting layer, and the third light-emitting layer,
wherein the first dichroic dye has an absorption peak wavelength between the first emission peak wavelength and the second emission peak wavelength,
the second dichroic dye has an absorption peak wavelength between the second emission peak wavelength and the third emission peak wavelength,
an angle of a molecule of the first dichroic dye in an absorption axis direction and an angle of a molecule of the second dichroic dye in an absorption axis direction with respect to a normal direction of the reflective layer are from 70 degrees to 90 degrees,
a difference between the second emission peak wavelength and the first emission peak wavelength is more than an average value of a full width half maximum of a spectrum of light emitted from the first light-emitting layer and a full width half maximum of a spectrum of light emitted from the second light-emitting layer, and
a difference between the third emission peak wavelength and the second emission wavelength is more than an average value of the full width half maximum of the spectrum of the light emitted from the second light-emitting layer and a full width halt maximum of a spectrum of light emitted from the third light-emitting layer.

2. The display device according to claim 1,
wherein the light absorbing member includes both the first dichroic dye and the second dichroic dye.

3. The display device according to claim 1,
wherein the absorption axis direction of the molecule of the first dichroic dye and the absorption axis direction of the molecule of the second dichroic dye are orthogonal to a normal direction of each of the first light-emitting layer, the second light-emitting layer, and the third light-emitting layer.

4. The display device according to claim 1,
wherein the absorption axis direction of the molecule of the first dichroic dye and the absorption axis direction of the molecule of the second dichroic dye are random as seen in the normal direction of each of the first light-emitting layer, the second light-emitting layer, and the third light-emitting layer.

5. The display device according to claim 1,
wherein the light absorbing member further includes a λ/4 retardation layer,
the λ/4 retardation layer is arranged on a side closer to the first light-emitting layer, the second light-emitting layer, and the third light-emitting layer, and
the absorption axis direction of the molecule of the first dichroic dye and the absorption axis direction of the molecule of the second dichroic dye are aligned at an angle of 45 degrees with respect to an optical axis of the λ/4 retardation layer as seen in the normal direction of each of the first light-emitting layer, the second light-emitting layer, and the third light-emitting layer.

6. The display device according to claim 1,
wherein the light absorbing member includes a first light absorbing member and a second light absorbing member,
the first light absorbing member includes the first dichroic dye, and
the second light absorbing member includes the second dichroic dye.

7. The display device according to claim 6,
wherein a second sealing layer is provided to the light absorbing member on a side opposite to a side to which the first light-emitting layer, the second light-emitting layer, and the third light-emitting layer are provided.

8. The display device according to claim 6,
wherein a first sealing layer is provided between the light absorbing member and the second electrode, a second sealing layer is provided to the light absorbing member on a side opposite to a side to which the first light-emitting layer, the second light-emitting layer, and the third light-emitting layer are provided, the first sealing layer and the second sealing layer are inorganic films, and the second sealing layer is held in contact with an end of the light absorbing member and in contact with a surface of the first sealing layer in a frame region.

9. The display device according to claim 1, wherein on a substrate, (i) active element layers forming a plurality of active elements, (ii) the first light-emitting layer, (iii) the second light-emitting layer, (iv) the third light-emitting layer, and (v) the light absorbing member are provided in an order of (i) through (v) from the substrate side, and each of the first light-emitting layer, the second light-emitting layer, and the third light-emitting layer is formed between a first electrode being the reflective layer and a second electrode.

10. The display device according to claim 9, wherein a first sealing layer is provided between the light absorbing member and the second electrode.

11. The display device according to claim 1, further comprising:

a light source portion configured to irradiate the second light-emitting layer and the third light-emitting layer with light, the light source portion being provided between at least the second light-emitting layer and the third light-emitting layer, and the reflective layer, wherein the second light-emitting layer and the third light-emitting layer emit light by being irradiated by the light source portion with the light.

12. The display device according to claim 11, wherein the light source portion includes the first light-emitting layer, and emits light having the first emission peak wavelength.

13. The display device according to claim 1, wherein at least one layer on a viewer side to the first light-emitting layer, the second light-emitting layer, and the third light-emitting layer includes at least one of a first nanoparticle and a second nanoparticle, the first nanoparticle having an absorption peak wavelength between the first emission peak wavelength and the second emission peak wavelength, the second nanoparticle having an absorption peak wavelength between the second emission peak wavelength and the third emission peak wavelength.

14. The display device according to claim 1, wherein at least one layer on a viewer side to the first light-emitting layer, the second light-emitting layer, and the third light-emitting layer includes a first absorbent configured to absorb light having a wavelength shorter than the first emission peak wavelength.

15. The display device according to claim 14, wherein at least one layer on the viewer side to the first light-emitting layer, the second light-emitting layer, and the third light-emitting layer is an adhesive material layer provided to the light absorbing member or the light absorbing member on a side to which the first light-emitting layer, the second light-emitting layer, and the third light-emitting layer are provided.

16. The display device according to claim 1, wherein at least one layer on a viewer side to the first light-emitting layer, the second light-emitting layer, and the third light-emitting layer includes a second absorbent configured to absorb light having a wavelength longer than the third emission peak wavelength.

17. The display device according to claim 1, wherein the first light-emitting layer, the second light-emitting layer, and the third light-emitting layer are light-emitting layers including quantum dots.

18. A display device comprising:

a first light-emitting layer having a first emission peak wavelength;

a second light-emitting layer having a second emission peak wavelength longer than the first emission peak wavelength;

a third light-emitting layer having a third emission peak wavelength longer than the second emission peak wavelength;

a reflective layer configured to reflect light, the reflective layer being provided as a lower layer to the first light-emitting layer, the second light-emitting layer, and the third light-emitting layer; and a light absorbing member including at least one kind selected from a first dichroic dye and a second dichroic dye, the light absorbing member being provided as an upper layer to the first light-emitting layer, the second light-emitting layer, and the third light-emitting layer, wherein the first dichroic dye has an absorption peak wavelength between the first emission peak wavelength and the second emission peak wavelength, the second dichroic dye has an absorption peak wavelength between the second emission peak wavelength and the third emission peak wavelength, an angle of a molecule of the first dichroic dye in an absorption axis direction and an angle of a molecule of the second dichroic dye in an absorption axis direction with respect to a normal direction of the reflective layer are from 70 degrees to 90 degrees, and a difference between the absorption peak wavelength of the second dichroic dye and the absorption peak wavelength of the first dichroic dye is more than the full width half maximum of the spectrum of the light emitted from the second light-emitting layer.

19. A display device comprising:

A display device comprising:

a first light-emitting layer having a first emission peak wavelength;

a second light-emitting layer having a second emission peak wavelength longer than the first emission peak wavelength;

a third light-emitting layer having a third emission peak wavelength longer than the second emission peak wavelength;

a reflective layer configured to reflect light, the reflective layer being provided as a lower layer to the first light-emitting layer, the second light-emitting layer, and the third light-emitting layer; and a light absorbing member including at least one kind selected from a first dichroic dye and a second dichroic dye, the light absorbing member being provided as an upper layer to the first light-emitting layer, the second light-emitting layer, and the third light-emitting layer, wherein the first dichroic dye has an absorption peak wavelength between the first emission peak wavelength and the second emission peak wavelength, the second dichroic dye has an absorption peak wavelength between the second emission peak wavelength and the third emission peak wavelength, an angle of a molecule of the first dichroic dye in an absorption axis direction and an angle of a molecule of the second dichroic dye in an absorption axis direction with respect to a normal direction of the reflective layer are from 70 degrees to 90 degrees, and the difference between the second emission peak wavelength and the first emission peak wavelength and the difference between the third emission peak wavelength and the second emission peak wavelength are equal to or more than 50 nm.

* * * * *